United States Patent
Sugawara et al.

(10) Patent No.: US 6,620,996 B2
(45) Date of Patent: Sep. 16, 2003

(54) PHOTOELECTRIC CONVERSION DEVICE

(75) Inventors: Shin Sugawara, Yokaichi (JP); Takeshi Kyoda, Yokaichi (JP); Hisao Arimune, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/866,069

(22) Filed: May 25, 2001

(65) Prior Publication Data

US 2002/0023674 A1 Feb. 28, 2002

(30) Foreign Application Priority Data

| May 29, 2000 | (JP) | 2000-159043 |
| May 30, 2000 | (JP) | 2000-161267 |
| Aug. 28, 2000 | (JP) | 2000-258027 |
| Jul. 27, 2000 | (JP) | 2000-227640 |
| Jun. 28, 2000 | (JP) | 2000-194395 |
| Jun. 30, 2000 | (JP) | 2000-198451 |

(51) Int. Cl.$^7$ ........................ H01L 31/0352
(52) U.S. Cl. ............... 136/250; 136/258; 136/256; 136/244; 257/431; 257/461; 257/443; 438/63
(58) Field of Search ............... 136/250, 258, 136/256, 244; 257/431, 461, 443; 438/63

(56) References Cited

U.S. PATENT DOCUMENTS

| 3,025,335 A | * | 3/1962 | Ralph | 136/250 |
| 4,514,580 A |   | 4/1985 | Bartlett | 136/250 |
| 4,614,835 A | * | 9/1986 | Carson et al. | 136/250 |
| 4,947,219 A | * | 8/1990 | Boehm | 136/250 |
| 5,414,275 A | * | 5/1995 | Sugawa et al. | 257/53 |
| 6,399,412 B1 | * | 6/2002 | Asai et al. | 438/63 |
| 6,437,234 B1 | * | 8/2002 | Kyoda et al. | 136/250 |

FOREIGN PATENT DOCUMENTS

| JP | 55-158678 A | * | 12/1980 |
| JP | 61-124179 |   | 6/1986 |
| JP | 3-228379 A | * | 10/1991 |
| JP | 8-34177 |   | 3/1996 |
| JP | 2641800 B2 |   | 5/1997 |

* cited by examiner

Primary Examiner—Alan Diamond
(74) Attorney, Agent, or Firm—Hogan & Hartson, LLP

(57) ABSTRACT

An insulator is formed on a substrate, on which numerous first conductivity-type crystalline semiconductor particles are deposited on and brought into contact with the substrate. A second conductivity-type semiconductor layer for forming a PN-junction between the layer and the crystalline semiconductor particles is formed over the crystalline semiconductor particles and the insulator. The second conductivity-type semiconductor layer comprises a semiconductor layer including a crystalline semiconductor and an amorphous semiconductor in a mixed manner.

24 Claims, 8 Drawing Sheets

PHOTOELECTRIC CONVERSION DEVICE

This application is based on applications Nos. 2000-159043, 2000-161267, 2000-194395, 2000-198451, 2000-227640, 2000-258027 filed in Japan, the content of which is incorporated hereinto by reference.

BACKGROUND OF THE INVENTION

1. Field of the Invention

The present invention relates to a photoelectric conversion device, in particular, to a photoelectric device using numerous crystalline semiconductor particles. The photoelectric conversion device according to this invention is utilized suitably in solar cells.

2. Description of the Related Art

Advent of a next-generation, low-cost solar cell that allows the quantity of silicon material to be small has been eagerly awaited.

Conventional photoelectric devices in which granular or spherical silicon crystal grains are used are shown in FIGS. 14–17.

The photoelectric conversion device in FIG. 14 comprises a low melting-point metal (tin) layer 108 formed on a substrate 101, numerous crystalline semiconductor particles 103 of a first conductivity-type deposited on the low melting-point metal layer 108, and an amorphous semiconductor layer 107 of a second conductivity-type formed on the crystalline semiconductor particles 103 (Refer to Japanese Patent No. 2641800).

In addition, an insulating layer 102 (SiO$_2$) is interposed between the amorphous semiconductor layer 107 and the low melting-point metal layer 108.

Since the amorphous semiconductor layer 107 serves as the second conductivity-type semiconductor layer in the photoelectric device in FIG. 14, the thickness of the amorphous semiconductor layer 107 needs to be small taking the great light absorption thereof into account. For this reason, the film thickness locally varies when the amorphous semiconductor layer 107 is formed along the surfaces of the crystalline semiconductor particles 103. In general, the film thickness in the part on the crystalline semiconductor particles 103 is large, and that in the side of the crystalline semiconductor particles 103 is small.

The thin films fail to sufficiently cover the whole surfaces of the crystalline semiconductor particles 103 making it difficult to form a PN-junction along the outer contours of the crystalline semiconductor particles 103.

Also, the small thickness of the amorphous semiconductor layer 107 makes the tolerance to defects small also necessitating stricter management of the cleaning process and the production environment.

In addition, since the thin amorphous semiconductor layer 107 has high resistance, a transparent conductive film needs to be formed as the upper electrode on the amorphous semiconductor layer 107, which results in a high manufacturing cost.

In this device, since the insulating layer 102 is formed after securing the particles 103 on the low melting-point metal layer 108, the insulating layer 102 is formed not only on the low melting-point metal layer 108 but also on the particles 103. Accordingly, the insulating layer 102 on the particles 103 needs to be removed before the formation of the amorphous semiconductor layer 107.

Although it is possible to form the amorphous semiconductor layer 107 after grinding the crystalline semiconductor particles 103 and the insulating layer 102 so as to be exposed in a flat surface, this necessitates addition of a grinding process and a cleaning process for removing chips after the grinding. Furthermore, when there is unevenness in the heights of crystalline semiconductor particles 103, the PN-junction area also locally varies causing insufficient properties. As a result, the device suffers high costs and low conversion efficiency.

Also, the low melting point of the low melting-point metal layer 108 makes its reliability low.

Regarding the auxiliary electrode, the Japanese Patent No. 2641800 only describes that an appropriate metal collector electrode is formed, and it includes no specific description about preferred electrodes.

FIG. 15 discloses a photoelectric conversion device in which an upper aluminum foil 111 is formed with openings 111a with which silicon balls 110 are contacted. Each of the silicon balls 110 has a n-type surface portion 110b formed on a p-type core 110a. The n-type surface portions 110b in the rear surfaces of the silicon balls 110 are removed, and the aluminum foil 111 is coated with an oxide layer 114. The oxide layer 114 in the rear surfaces of the silicon balls 110 are removed so that the p-type cores 110a are contacted with a lower aluminum foil 113 (Japanese Unexamined Patent publication S61-124179(A)).

The device in FIG. 15 requires production of the silicon balls 110 having the n-type surface portions 110b formed on the p-type cores 110a. In addition, the openings 111a need to be formed in the aluminum foil 111 so that the silicon balls 110 are pressed into and contacted with the openings 111a. This requires the silicon balls 110 to be uniform in diameter, resulting in high cost manufacture.

The photoelectric conversion device in FIG. 15 has another problem in that when the silicon balls 110 are contacted with the lower aluminum foil 113, the lower aluminum foil 113, the substrate, melts when the junction temperature increases to no less than 577° C., which is the eutectic temperature of aluminum and silicon. As a result, the silicon balls 110 penetrate the aluminum foil 113.

FIG. 16 discloses a method in which semiconductor microcrystalline grains 123 are deposited on a substrate 120, and then fused, saturated and gradually cooled so that the semiconductor is grown by liquid phase epitaxial growth, thereby forming a first conductivity-type polycrystalline thin film 123 (Japanese Patent Publication No.H8-34177(B)).

FIG. 16 shows a low melting-point metal film 121 comprising a metal such as Sn, a high melting-point metal film 122 comprising a metal such as Mo, a second conductivity-type polycrystalline or amorphous semiconductor layer 124, and a transparent conductive film 125.

In the photoelectric conversion device in FIG. 16, the low melting-point metal 121 mixes into the first conductivity-type liquid phase epitaxial polycrystalline layer 123, thereby deteriorating the performance of the polycrystalline layer 123. In addition, due to the absence of an insulator between the transparent conductive film 125 and the high melting-point metal film 122, short circuit is likely to occur.

FIG. 17 discloses a photoelectric conversion device, wherein an aluminum film 132 is formed on the surfaces of a steel substrate 131, the aluminum film 132 being contacted with crushed silicon particles 133, and then an insulating layer 136, n-type silicon portions 134, and a transparent conductive layer 135 are sequentially formed (U.S. Pat. No. 4,514,580).

In this photoelectric device, since the aluminum film 132 is formed on the surface of the steel substrate 131, the aluminum film 132 is oxidized first, and the steel substrate 131 is oxidized thereafter. This makes the reliability of this photoelectric conversion device low, and the life thereof short.

In order to secure the reliability, the aluminum film 132 needs to be thickened. However, when the aluminum film 132 is thickened, the crushed silicon particles 133 in contact with it need to have diameters increased accordingly, which is a problem.

There is a description in the disclosure of the photoelectric conversion device in FIG. 17 meaning that the electrode may comprise any desired pattern of bus bars and fingers. However, it has no specific description of preferred auxiliary electrodes.

It is an object of this invention to provide a photoelectric conversion device with excellent properties.

BRIEF SUMMARY OF THE INVENTION

A photoelectric conversion device according to the present invention comprises: first conductivity-type crystalline semiconductor particles being deposited on and in contact with a substrate in a large number; an insulator formed in an area on the substrate where the crystalline semiconductor particles are not present; and a second conductivity-type semiconductor layer formed over the crystalline semiconductor particles and the insulator so as to form a PN-junction between the semiconductor layer and the crystalline semiconductor particles, wherein the second conductivity-type semiconductor layer comprises a semiconductor layer including a crystalline semiconductor and an amorphous semiconductor in a mixed manner.

Because layer-depositing conditions for forming the semiconductor layer including a crystalline semiconductor and an amorphous semiconductor in a mixed manner are wider than the conditions for forming a crystalline semiconductor layer, this photoelectric conversion device yields a large manufacturing margin, thereby allowing for a low-cost production.

Also, the particle diameters of the crystalline semiconductor particles having a single conductivity type do not need to have a high level of uniformity, which enables the device to be manufactured at low cost.

The second conductivity-type semiconductor layer comprising a crystalline semiconductor and an amorphous semiconductor in a mixed manner has high light transmittance, which allows the thickness thereof to be more flexible so that the layer exhibits good covering performance.

The insulator ensures separation of the positive electrode and the negative electrode, thereby preventing short circuit from occurring between the crystalline semiconductor particles and the conductive film. The device therefore has high conversion efficiency.

Accordingly, when compared with known photoelectric conversion devices, the device according to this invention enables the manufacture thereof to be carried out at lower cost while exhibiting high properties.

The aforementioned second conductivity-type semiconductor layer can function also as the upper electrode. Accordingly, boring a hole in the electrode, which is necessary when the upper electrode is separately provided, is no longer necessary in this device. This permits utilization of the light incident on the area without semiconductor particles. As a result, the device can be more inexpensive and achieve better conversion efficiency.

Furthermore, owing to the flexibility in shape, the photoelectric conversion device of this invention has little dependence on the light incidence angle.

A photoelectric conversion device according to the present invention comprises: first conductivity-type crystalline semiconductor particles being deposited on and in contact with a substrate in a large number; an insulator formed in an area on the substrate where the crystalline semiconductor particles are not present; and a second conductivity-type semiconductor layer formed over the crystalline semiconductor particles and the insulator so as to form a PN-junction between the semiconductor layer and the crystalline semiconductor particles, wherein the substrate is formed by laminating a first aluminum-iron alloy layer, an iron layer, a second aluminum-iron alloy layer, and an aluminum layer.

Preferably, the above-mentioned substrate should be formed by sequentially laminating and heating a first aluminum layer, an iron layer, and a second aluminum layer.

By providing aluminum having a low melting point and large electric conductivity in the area where the substrate and the crystalline semiconductor particles are in contact, low-temperature junction and low-resistance electrode can be realized in this photoelectric conversion device.

However, when the substrate consists of only aluminum, fusion-bonding between the crystalline semiconductor particles and the aluminum proceeds without limitation, thereby making control of the junction difficult. As an effective measure for controlling the junction, a metal having a melting point higher than aluminum is disposed beneath the aluminum so that the fusion-bonding does not advance beyond the thickness of the aluminum.

As the metal with a high melting point, iron is optimal in terms of melting point, rigidity, thermal expansivity, and cost. However, iron has a problem of weak weather resistance due to its susceptibility to oxidization.

Accordingly, in this invention, the iron is protected by the aluminum-iron alloy, thereby attaining high reliability.

A photoelectric conversion device according to the present invention comprises: first conductivity-type crystalline semiconductor particles being deposited on and in contact with a substrate in a large number; an insulator formed in an area on the substrate where the crystalline semiconductor particles are not present; and a second conductivity-type semiconductor layer formed over the crystalline semiconductor particles and the insulator so as to form a PN-junction between the semiconductor layer and the crystalline semiconductor particles, wherein the relation in weight between the insulator and the crystalline semiconductor particles is $V1 \times \rho1 \geq V2 \times \rho2$ (V1: volume of one crystalline semiconductor particle, V2: volume of one crystalline semiconductor particle in the part being buried in the insulator, $\rho1$: specific gravity of the crystalline semiconductor particles, $\rho2$: specific gravity of the insulator).

This photoelectric conversion device allows for formation of a good insulator while a junction is formed between the substrate and the semiconductor particles, thereby ensuring separation of the positive electrode and the negative electrode. As a result, this device provides larger manufacturing margin and lower manufacturing cost when compared with conventional photoelectric conversion devices.

A photoelectric conversion device according to the present invention comprises: first conductivity-type crystalline semiconductor particles being deposited on and in contact with a substrate in a large number; an insulator formed in an area on the substrate where the crystalline semiconductor particles are not present; a second conductivity-type semiconductor layer formed over the crystalline semiconductor particles and the insulator so as to form a PN-junction between the semiconductor layer and the crystalline semiconductor particles; and an electrode formed in the second conductivity-type semiconductor layer, wherein the area of a portion of the electrode formed in the second conductivity-type semiconductor layer that is present above the crystalline semiconductor particles is 10% or less of the whole area of the electrode.

According to this photoelectric device, the electrode is formed such that the area of the electrode under which the crystalline semiconductor particles are present is only 10% or less of the whole area of the electrode.

This allows the photoelectric conversion device to have high reliability as well as high properties.

A photoelectric conversion device according to the present invention comprises: first conductivity-type crystalline semiconductor particles being deposited on and in contact with a substrate in a large number; an insulator formed in an area on the substrate where the crystalline semiconductor particles are not present; and a second conductivity-type semiconductor layer formed over the crystalline semiconductor particles and the insulator so as to form a PN-junction between the semiconductor layer and the crystalline semiconductor particles, wherein the second conductivity-type semiconductor layer comprises two layers each of which has an impurity addition concentration that differs from the other such that the impurity addition concentration in the lower layer of the second conductivity-type semiconductor layer is lower than that in the upper layer of the second conductivity-type semiconductor layer.

According to this photoelectric conversion device, the upper layer of the second conductivity-type semiconductor layer with higher impurity addition concentration can reduce the series resistance and prevent the conversion efficiency from lowering.

In addition, due to the lower impurity addition concentration in the lower layer of the second conductivity-type semiconductor layer, leakage current is prevented from occurring. Accordingly, this device can achieve conversion efficiency higher than that of known photoelectric conversion devices.

DETAILED DESCRIPTION OF THE INVENTION

<Embodiment A>

Figure 1:
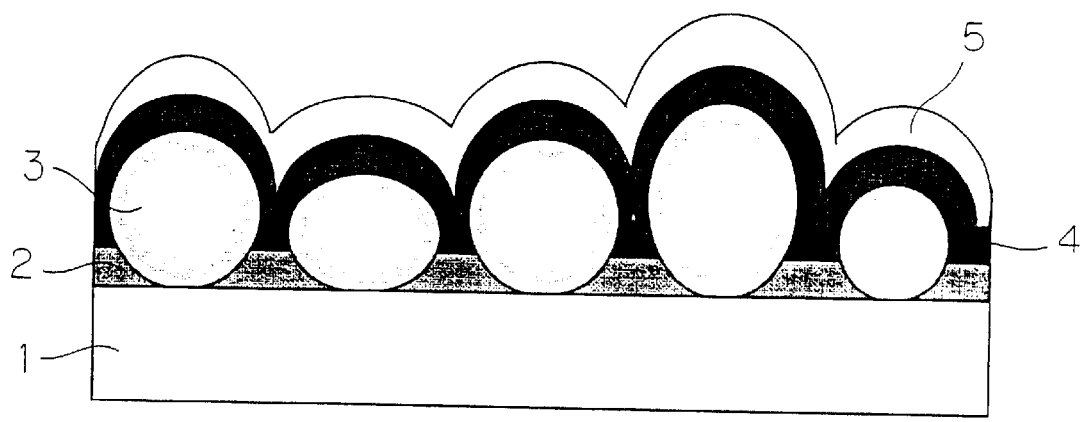
FIG. 1 is a cross-sectional view showing a photoelectric conversion device according to the present invention.

FIG. 1 is a cross-sectional view of a photoelectric conversion device according to the present invention. FIG. 1 shows a substrate 1, an insulating layer 2, a first conductivity-type crystalline semiconductor particle 3, a semiconductor layer 4 where a crystalline semiconductor and an amorphous semiconductor are present in a mixed manner, and a transparent conductive film 5.

Metals, ceramics, resins or the like are used for the substrate. The substrate 1 needs to have conductivity so as to serve also as the lower electrode. When the substrate 1 comprises a metal, the substrate 1 is formed as a single metal layer or a plurality of metal layers. When the substrate 1 comprises an insulator such as ceramics or resin, the substrate 1 needs to be formed with a conductive layer thereon.

The insulating layer 2 is formed in order to separate the positive electrode from the negative electrode. The insulating layer is formed by using, for example, glass slurry composed of components such as $SiO_2$, $Al_2O_3$, $PbO$, $ZnO$, and the like.

The thickness of the insulating layer 2 should preferably be not less than 1 $\mu$m nor more than ⅔ of the average particle size of the crystalline semiconductor particles 3. When the thickness of the insulating layer 2 exceeds ⅔ of the average particle size of the crystalline semiconductor particle 3, the PN-junction forming area becomes too small to efficiently collect carriers, which is unfavorable. When the thickness of the insulating layer 2 is less than 1 $\mu$m, insulation between the substrate 1 and the semiconductor layer 4 including a crystalline semiconductor and an amorphous semiconductor in a mixed manner becomes insufficient so that the substrate 1 and the semiconductor layer 4 partly come into contact with each other causing short circuit, which is also unfavorable.

The first conductivity-type crystalline semiconductor particles comprise 3 Si, Ge, and a small amount of p-type impurity such as B, Al, and Ga, or n-type impurity such as P and As.

The shapes of the semiconductor particles 3 may comprise polygons, curved surfaces or the like. Preferably, they should comprise curved surfaces, especially spherical shapes so that they efficiently push the insulating layer 2 aside when they are pressed from above the insulating layer 2 into the insulating layer 2 until they come into contact with the substrate 1.

The particle diameters may be even or uneven. However, uneven particle diameters will be advantageous to make the device less expensive, because additional process is necessary in order to uniformize the particle diameters.

Preferably, the particle diameters should be in the range of 10–500 $\mu$m. Particles with diameters less than 10 $\mu$m are not preferable because they cause the insulating layer 2 to adhere to the pressing jig for pressing the particles, thereby contaminating the surfaces of semiconductor particles 3. Also, using semiconductor particles with diameters exceeding 500 µm makes no difference in the amount of the semiconductor material to be used from the amount used in conventional flat plate photoelectric conversion devices, which neutralizes the material-saving advantage of using spherical particles.

The second conductivity-type semiconductor layer 4 comprising a crystalline semiconductor and an amorphous semiconductor in a mixed manner is formed by the catalytic CVD method, the VHF-CVD method, or the plasma CVD method, in which, for example, a vapor-phase phosphorous system compound that is a n-type impurity or a vapor-phase boron system compound that is a p-type impurity is added in a small amount to a vapor-phase silane compound.

The conditions for forming the semiconductor layer 4 comprising a crystalline semiconductor and an amorphous semiconductor in a mixed manner are wider than those for forming a crystalline semiconductor layer, which allows for larger manufacturing margin leading to a low-cost production. In addition, since the crystalline semiconductor particles 3 and the semiconductor layer 4 comprising a crystalline semiconductor and an amorphous semiconductor in a mixed manner make a hetero-junction in this device, the conversion efficiency is improved.

Figure 14:
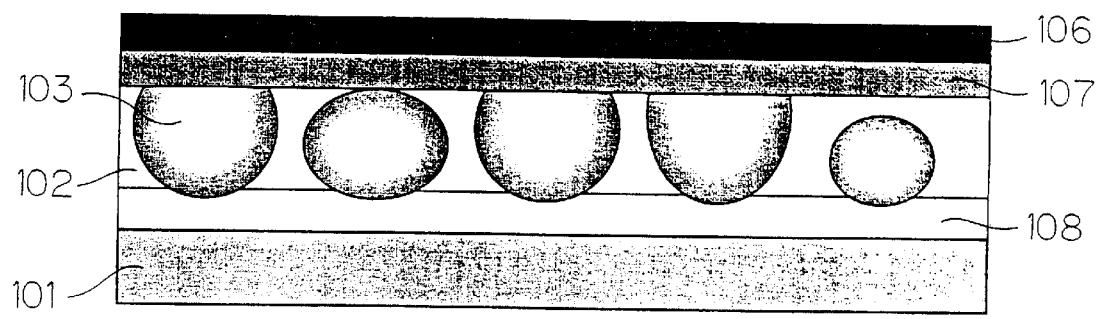
FIG. 14 is a cross-sectional view of a conventional photoelectric conversion device.
Figure 15:
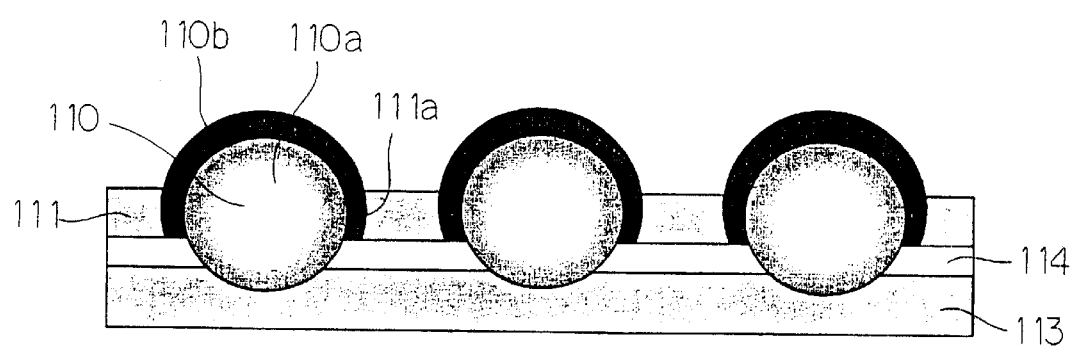
FIG. 15 is a cross-sectional view of a conventional photoelectric conversion device.
Figure 16:
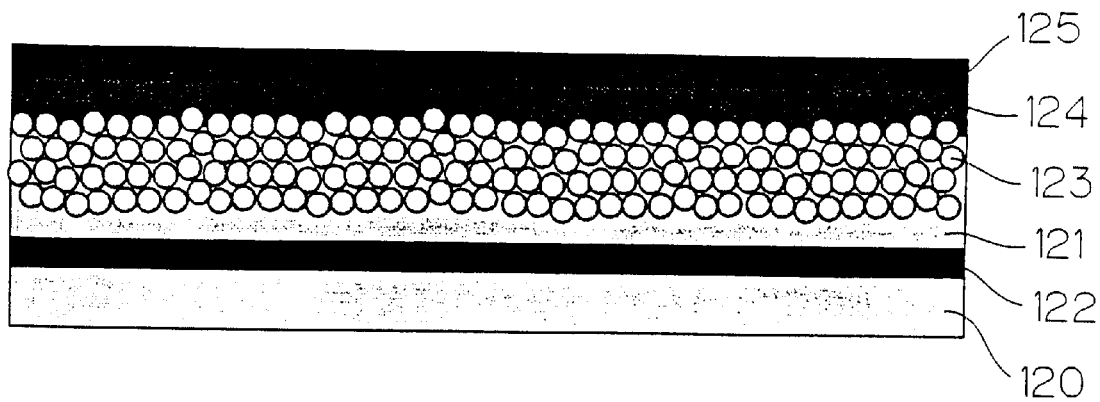
FIG. 16 is a cross-sectional view of a conventional photoelectric conversion device.
Figure 17:
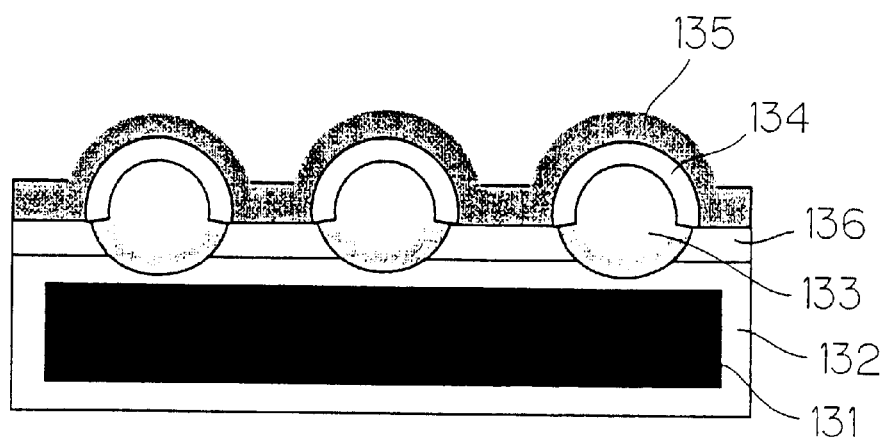
FIG. 17 is a cross-sectional view of a conventional photoelectric conversion device.

Preferably, the semiconductor layer 4 comprising a crystalline semiconductor and an amorphous semiconductor in a mixed manner should be formed along the surfaces of the semiconductor particles 3, that is, it should not be formed in a flat manner as shown in FIG. 14. By forming the junction along the surfaces of the semiconductor particles 3, carriers generated at any position within the crystalline semiconductor particles 3 can be efficiently collected.

When the semiconductor layer 4 is formed into a film having an irregular surface, it is difficult to thoroughly cover the exposed portion of the particles 3 along the surfaces of the particles if the film is too thin. On the other hand, although a film with too large thickness may exhibit good covering performance, loss due to the light absorption by the semiconductor layer 4 becomes so great that it causes the conversion efficiency to drop.

Since the semiconductor layer 4 comprising a crystalline semiconductor and an amorphous semiconductor in a mixed manner absorbs light less than that an amorphous semiconductor layer absorbs, thickening the film doesn't result in a rapid increase in the loss. The thickness should preferably be 50–300 nm. It is undesirable to make the thickness less than 50 nm because in such a case, the covering performance deteriorates and leakage due to direct contact of the semiconductor particles 3 with the transparent conductive film 5 occurs, thereby deteriorating the properties. It is also unfavorable for the film thickness to be larger than 300 nm because in such a case, the conversion efficiency and the low productivity and the material cost increases, leading to high cost manufacture.

The transparent conductive film 5 is formed, for example, of tin oxide or ITO by the sputtering method, plasma CVD method or the like. Preferably, the sunlight absorption of the transparent conductive film 5 should be small because a great amount of sunlight absorption by the transparent conductive film 5 results in lowering of the conversion efficiency.

The thickness of the transparent conductive film 5 should preferably be in the range of 10–300 nm. When the thickness is less than 10 nm, the resistance increases causing the conversion efficiency to drop, which is unfavorable. When the thickness is larger than 300 nm, the light absorption is increased causing the conversion efficiency to lower. Also, in such a case, the productivity is lowered and the material cost is expanded leading to high cost manufacture, which is unfavorable.

In addition, the transparent conductive film 5 may be provided with a protective film thereon. The protective film may be formed by using silicon nitride, titanium oxide or the like by the sputtering method, the plasma CVD method or the like. It is possible to endow the protective film with functions for multireflection effect, reflection preventive effect, weather resistance improving effect and the like.

Meanwhile, it is desirable to form a first conductivity-type portion having high concentration in an outer peripheral portion of the semiconductor particles 3 near the boundary between the substrate 1 and the semiconductor particles 3. By forming such a first conductivity-type portion having high concentration, carriers generated in the semiconductor particles 3 are efficiently separated so that the conversion efficiency is enhanced. As a method of forming such a highly concentrated first conductivity-type portion, the following method may be employed: A substrate 1 and semiconductor particles 3 are brought into contact and heated so that a part of the elements of the substrate 1 or a part of the elements of a conductive film that has been formed on the substrate 1 is diffused in the outer peripheries of the semiconductor particles 3.

EXAMPLE A

Example A-1

First, an insulating layer 2 was formed on a substrate 1. The substrate was made by using aluminum. The insulating layer 2 was formed 80 µm thick by using glass paste. Then, polycrystalline p-type silicon particles 3 with an average particle diameter of 200 µm were densely deposited on the insulating layer so as to form a layer. The sample was then heated up to the softening temperature of the insulating layer 2 or above so that the silicon particles 3 sank into the insulating layer 2 until they came into contact with the substrate 1. Subsequently, a mixture layer 4 comprising a n-type crystalline silicon and an amorphous silicon was formed over the silicon particles 3 and the insulating layer 2 (Samples 1–7). Properties obtained as a result of varying the thickness of the mixture layer 4 comprising a n-type crystalline silicon and an amorphous silicon are shown in Table 1. A transparent conductive film 5 which comprised tin oxide and was 500 nm in thickness was then formed on the mixture layer 4, on which a protective film comprising silicon nitride was formed 500 nm thick.

TABLE 1

| Sample No. | Structure | Thickness (µm) | Conversion efficiency (%) | Covering performance | Overall evaluation |
|---|---|---|---|---|---|
| 1 | Crystalline-amorphous mixed | 10 | — | X | |
| 2 | Crystalline-amorphous mixed | 30 | 12.2 | Δ | |
| 3 | Crystalline-amorphous mixed | 50 | 11.6 | ○ | Good |
| 4 | Crystalline-amorphous mixed | 100 | 10.4 | ⊚ | Good |

TABLE 1-continued

| Sample No. | Structure | Thickness (μm) | Conversion efficiency (%) | Covering performance | Overall evaluation |
|---|---|---|---|---|---|
| 5 | Crystalline-amorphous mixed | 200 | 9.8 | ◉ | Good |
| 6 | Crystalline-amorphous mixed | 300 | 9.1 | ◉ | Good |
| 7 | Crystalline-amorphous mixed | 400 | 7.3 | ◉ | |
| 8 | Amorphous | 10 | — | X | |
| 9 | Amorphous | 30 | 6.8 | Δ | |
| 10 | Amorphous | 50 | 4.4 | ○ | |
| 11 | Amorphous | 100 | 1.9 | ◉ | |
| 12 | Amorphous | 200 | 1.5 | ◉ | |
| 13 | Amorphous | 300 | 1.0 | ◉ | |
| 14 | Amorphous | 400 | 0.8 | ◉ | |
| 15 | Crystalline | 10 | 9.5 | X | |
| 16 | Crystalline | 30 | 8.2 | Δ | |
| 17 | Crystalline | 50 | 8.0 | ○ | |
| 18 | Crystalline | 100 | 7.9 | ◉ | |
| 19 | Crystalline | 200 | 7.8 | ◉ | |
| 20 | Crystalline | 300 | 7.7 | ◉ | |
| 21 | Crystalline | 400 | 7.4 | ◉ | |

As a comparative example, samples in which a n-type amorphous silicon layer was formed instead of the mixture layer 4 comprising a n-type crystalline silicon and an amorphous silicon were prepared (Samples 8–14). Properties obtained as a result of varying the thickness of the n-type crystalline silicon layer are shown in Table 1 (Samples 15–21) for the sake of comparison.

The "covering performance" in Table 1 was evaluated based on the frequency of occurrence of leakage due to direct contact between the crystalline silicon particles and the transparent conductive film. When the covering performance of the n-type silicon layer is sufficient, the crystalline silicon particles and the transparent conductive film do not contact directly. Specifically, 10 sets were prepared for each sample, where samples in which leakage occurred to every set were marked by X, and samples suffered leakage in 9–3 sets, 2–1 sets, no sets were marked by Δ, ○, ◉, respectively.

The "conversion efficiency" was evaluated by measuring ones with no leakage, and calculating the average. Samples that were good in both conversion efficiency and covering performance were marked by "Good".

As is apparent from the above result, samples in which the mixture layer 4 comprising crystalline silicon and amorphous silicon was formed had sufficient covering performance, as well as high conversion efficiency when compared with the samples using the amorphous silicon layer. Covering performance as good as ○ or more is necessary for the manufacture.

In the case of using the amorphous silicon layer, the conversion efficiency was always less than 5% when the thickness was 50 nm or more at which the covering performance was good. They are therefore impractical. This may be explained that due to the light absorption rate of the amorphous silicon layer that is larger than that of the crystalline silicon-amorphous silicone mixture layer, the light transmittance becomes small as the thickness increases.

When the crystalline silicon layer was used, the conversion efficiency is lower than that in the case of using the crystalline silicon-amorphous silicon mixture layer. However, due to its small light absorption, the conversion efficiency is high compared with that in the case of using the crystalline silicon-amorphous silicon mixture layer when the thickness is more than 250 nm. Accordingly, it is understood that the appropriate range of the thickness in the case of using the crystalline silicon-amorphous silicon mixture layer is 50 nm–300 nm. The silicon layer with a thickness of less than 50 nm had insufficient covering performance, and that with a thickness more than 300 nm had deteriorated conversion efficiency. Both are therefore unfavorable.

Example A2

In the next step, differences caused by the configuration of the PN-junction were evaluated. Samples with a different PN-junction configuration were prepared as a comparative example of the samples No. 1–7 above (Samples 22–28).

The comparative example was made as follows: First, an insulating layer 2 was formed on a substrate 1. Aluminum was used to form the substrate 1. The insulating layer 2 was formed using glass paste to be 200 μm thick. Then, polycrystalline p-type silicon particles 3 with an average particle diameter of 200 μm were densely deposited on the insulating layer so as to form a layer. The sample was then heated up to the softening temperature of the insulating layer 2 or above so that the silicon particles 3 sank into the insulating layer 2 until they came into contact with the substrate 1. Subsequently, the silicon particles 3 and the insulating layer 2 were ground so as to be exposed in a flat surface. A mixture layer 4 comprising a n-type crystalline silicon and an amorphous silicon was then formed on the silicon particles 3 and the insulating layer 2, on which a transparent conductive film comprising tin oxide was formed 500 nm thick. Then, a protective film comprising silicon nitride was formed on that film to be 500 nm thick.

A result of evaluation carried out by varying the thickness of the mixture layer 4 comprising a n-type crystalline silicon and an amorphous silicon is shown in Table 2.

TABLE 2

| Sample No. | PN-junction | Thickness (μm) | Conversion efficiency (%) | Covering performance | Overall evaluation |
|---|---|---|---|---|---|
| 1 | Particle surface | 10 | — | X | |
| 2 | Particle surface | 30 | 10.2 | Δ | |
| 3 | Particle surface | 50 | 9.6 | ○ | Good |
| 4 | Particle surface | 100 | 8.5 | ◉ | Good |
| 5 | Particle surface | 200 | 7.8 | ◉ | Good |
| 6 | Particle surface | 300 | 6.5 | ◉ | Good |
| 7 | Particle surface | 400 | 5.3 | ◉ | |
| 22 | Flat surface | 10 | 4.9 | ○ | |
| 23 | Flat surface | 30 | 4.6 | ◉ | |
| 24 | Flat surface | 50 | 4.2 | ◉ | |
| 25 | Flat surface | 100 | 4.0 | ◉ | |
| 26 | Flat surface | 200 | 3.6 | ◉ | |
| 27 | Flat surface | 300 | 3.4 | ◉ | |
| 28 | Flat surface | 400 | 3.1 | ◉ | |

As shown in the above result, the covering performance was good in the case of the PN-junction in the form of a flat surface. However, the conversion efficiency was low, and thus these are impractical.

When the PN-junction is formed along the surfaces of the particles as in the above samples No. 1–7 with the thickness of the n-type silicon layer in the range of 50–300 nm, good properties in both covering performance and conversion efficiency can be obtained.

<Embodiment B>

Figure 2:
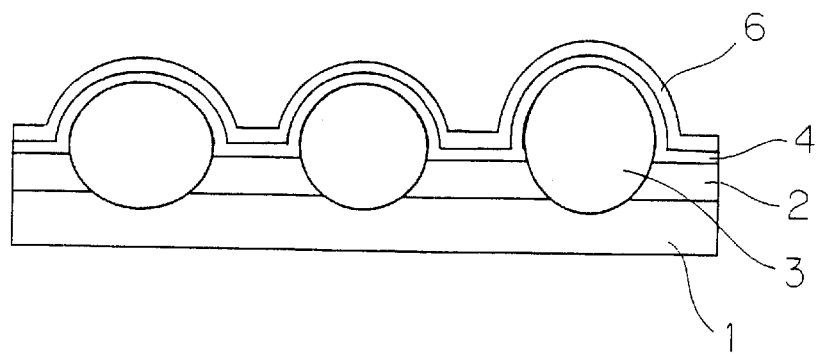
FIG. 2 is a cross-sectional view of a photoelectric conversion device according to the present invention.
Figure 3:
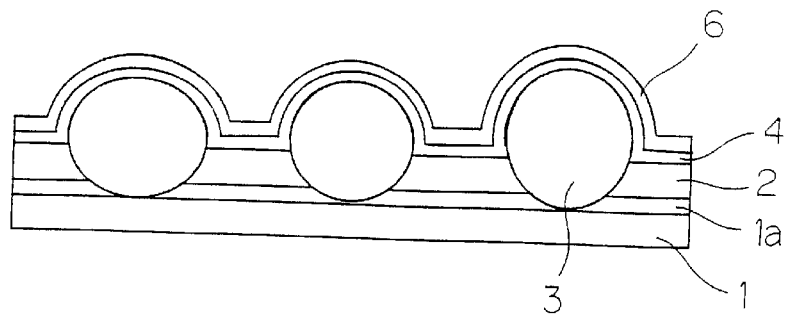
FIG. 3 is a cross-sectional view of a photoelectric conversion device according to the present invention.

FIGS. 2 and 3 are cross-sectional views showing a photoelectric conversion device according to the present invention. FIGS. 2 and 3 illustrate a substrate 1, an insulator 2, first conductivity-type semiconductor particles 3, a second conductivity-type semiconductor layer 4 comprising a crystalline semiconductor and an amorphous semiconductor in a mixed manner, and a protective film 6.

The substrate 1 comprises metal, ceramics, resin or the like. Since the substrate 1 is to function also as the lower electrode, it may be any one as long as it has conductivity. When the material for the substrate is metal, the substrate is formed as a single metal layer or a plurality of layers in which different metal layers are laminated. When the substrate is made of an insulator such as ceramics or resin, a conductive layer 1a as shown in FIG. 3 needs to be formed on the substrate 1. The requisite characteristic of the conductive layer 1a is the same as in the case of the metal substrate 1.

The first conductivity-type crystalline semiconductor particles 3 comprise Si, Ge, and a small amount of p-type impurity such as B, Al, and Ga, or n-type impurity such as P and As.

The shapes of the semiconductor particles 3 may comprise polygons, curved surfaces or the like. Preferably, they should comprise curved surfaces, especially spherical shapes so that they efficiently push the insulating layer 2 aside when they are pressed from above the insulating layer 2 into the insulating layer 2 until they come into contact with the substrate 1.

The particle diameters may be even or uneven. However, uneven particle diameters will be advantageous to make the device less expensive, because an additional process is necessary in order to uniformize the particle diameters. Incidentally, the semiconductor particles will be brought into sufficient contact with the substrate 1 even when the particle diameters are uneven by using a pressing jig made of a flexible material when pressing the semiconductor particles 3 from above the insulating layer 2 so as to contact with the substrate 1. Furthermore, having convex surfaces reduces dependence on the light incidence angle.

Preferably, the particle diameters should be in the range of 10–500 μm. Particles with diameters less than 10 μm are not preferable because they cause the insulating layer 2 to adhere to the pressing jig for pressing the particles, thereby contaminating the surfaces of semiconductor particles 3. Also, using semiconductor particles with diameters exceeding 500 μm makes no difference in the amount of the semiconductor material to be used from the amount used in conventional flat plate photoelectric conversion devices, which neutralizes the material-saving advantage of using spherical particles.

The insulator 2 comprises an insulating material for separating the positive electrode from the negative electrode. The insulating material may comprise, for example, glass slurry composed of components arbitrarily selected from among $SiO_2$, $Al_2O_3$, PbO, ZnO, $B_2O_3$, MgO and the like. The insulator 2 needs to have some degree of hardness or viscosity when placed on the substrate 1 so as to temporarily hold the semiconductor particles 3 pressed thereinto. In addition, it needs to have a characteristic capable of partly covering the semiconductor particles 3 by melting at a temperature of heat applied thereto for creating ohmic contact between the substrate 1 and the semiconductor particles 3 as mentioned later.

The semiconductor layer 4 comprising a crystalline semiconductor and an amorphous semiconductor in a mixed manner is formed by the vapor-phase growth method or the like, in which, for example, a vapor-phase phosphorous system compound that is a n-type impurity or a vapor-phase boron system compound that is a p-type impurity is added in a small amount to a vapor-phase silane compound. The conditions for forming the semiconductor layer 4 comprising a crystalline semiconductor and an amorphous semiconductor in a mixed manner are wider than those for forming a crystalline semiconductor layer, which brings an advantage of yielding a large manufacturing margin leading to low cost production. In addition, since the crystalline semiconductor particles 3 and the semiconductor layer 4 comprising a crystalline semiconductor and an amorphous semiconductor in a mixed manner make a hetero-junction in this device, the conversion efficiency is improved. The light transmittance of the semiconductor layer 4 comprising a crystalline semiconductor and an amorphous semiconductor in a mixed manner, which is higher when compared with that of an amorphous semiconductor layer, permits the thickness of the layer to be larger.

A part of the incident light passes through the semiconductor layer 4 comprising a crystalline semiconductor and an amorphous semiconductor in a mixed manner at the area where the semiconductor particles 3 are not present, and is reflected by the substrate 1 and directed at the semiconductor particles 3. This enables the light energy being transmitted in the whole photoelectric conversion device to be efficiently transmitted to the semiconductor particles 3. Preferably, the thickness of the semiconductor layer 4 should be 400 nm or less when considered in relation to the light transmittance, and any thickness larger than this rate deteriorates the light conversion efficiency.

In addition, since the semiconductor layer 4 comprising a crystalline semiconductor and an amorphous semiconductor in a mixed manner also serves as an electrode, it is not necessary to additionally form a transparent conductive film. The manufacturing process is thus simplified allowing further cost reduction. If a transparent conductive film is formed as an electrode, leakage will occur between the transparent conductive film and the semiconductor particles 3 located under defective portions generated when the semiconductor layer 4 comprising a crystalline semiconductor and an amorphous semiconductor in a mixed manner is formed.

The concentration of the microelement in the semiconductor layer 4 may be high when considered in combination with the conductivity, which is, for example, from $10^{16}$ to $10^{21}$ atm/$cm^3$. With the resistance taken into account, the thickness of the semiconductor layer 4 should preferably be 50 nm or more. Any thickness less than this rate will deteriorate the conversion efficiency. As a consequence of the discussion above, the thickness of the semiconductor layer 4 comprising a crystalline semiconductor and an amorphous semiconductor in a mixed manner should preferably be in the range of 50–400 nm.

Furthermore, it is desirable that the semiconductor layer 4 comprising a crystalline semiconductor and an amorphous semiconductor in a mixed manner is formed along the surfaces of the semiconductor particles 3 so that the PN-junction is formed in the vicinity of the surface where the light is incident as well as along the convex contours of the semiconductor particles 3. A wide area is made available for the PN-junction by forming the semiconductor layer 4 along the convex contours of the semiconductor particles 3 so that carriers generated inside the semiconductor particles 3 can be collected efficiently. In addition, the material for the semiconductor layer 4 comprising a crystalline semiconductor and an amorphous semiconductor in a mixed manner is more stable than that for an amorphous semiconductor layer. High reliability is therefore expected.

It is desirable for the protective film 6 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the semiconductor layer 4 comprising a crystalline semiconductor and an amorphous semiconductor in a mixed manner. The protective film 6 needs to be a transparent dielectric because transparency is necessary for a protective film being in contact with the surface where the light is incident, and leakage should be prevented from occurring between the upper part including the protective film 6 and the semiconductor particles 3 located under defective portions of the semiconductor layer 4 comprising a crystalline semiconductor and an amorphous semiconductor in a mixed manner. Incidentally, optimizing the thickness of the protective film 6 will enable it to function as an anti-reflection film.

Moreover, it is also possible to provide a patterned electrode comprising fingers and bus bars at regular intervals on the semiconductor layer 4 comprising a crystalline semiconductor and an amorphous semiconductor in a mixed manner or on the protective film 6 so as to lower the series resistance, thereby improving the conversion efficiency.

EXAMPLE B

Now, another example of a photoelectric conversion device according to this invention is described.

Example B1

A cross-sectional view of a photoelectric conversion device produced as sample 31 is shown in FIG. 3. An aluminum layer 1a with a thickness of 10 μm was formed on a substrate 1 including iron. An insulating, low melting-point glass layer 2 was formed thereon to be 50 μm thick, on which p-type silicon particles 3 with a diameter of 250 μm are densely deposited and brought into contact with the aluminum layer 1a. Then, the sample was heated as a whole up to the softening temperature of the insulating layer 2 or above. Subsequently, a mixture layer 4 comprising a mixture of n-type crystalline silicon and amorphous silicon was formed 200 nm thick over the silicon particles 3 and the insulating layer 2, on which a silicon nitride film was further formed as a protective film 6.

In sample 32, an aluminum substrate with its rear surface oxidized was used as the substrate 1. Other parts were made in the same way as in the sample 31 (The structure was the same as that in FIG. 2)

In sample 33, a Cu substrate formed with a 10 μm thick aluminum layer thereon was used as the substrate 1. Other parts were made in the same way as in the sample 31.

In sample 34 an alumina substrate formed with a 10 μm thick aluminum layer thereon was used as the substrate 1. Other parts were made in the same way as in the sample 31.

The samples 31–34 above correspond to an embodiment of this invention.

In sample 35, a mixture layer 4 comprising a n-type crystalline silicon and an amorphous silicon was formed 150 nm thick in the same way as in the sample 31, and then a transparent conductive film comprising tin oxide (ITO) was formed on the mixture layer 4.

Figure 4:
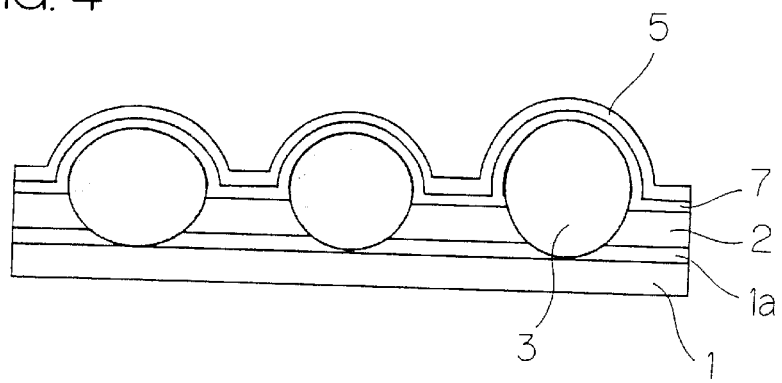
FIG. 4 is a cross-sectional view of a photoelectric conversion device according to a comparative example.

A cross-sectional view of sample 36 is shown in FIG. 4. The sample 36 was made in the same way as in the sample 31 except for the semiconductor layer 4 comprising crystalline silicon and amorphous silicon in a mixed manner. Instead of the semiconductor layer 4 comprising crystalline silicon and amorphous silicon in a mixed manner, a n-type amorphous silicon layer 7 was formed 150 nm thick over the silicon particles 3 and the insulating layer 2, on which a transparent conductive film comprising tin oxide (ITO) 5 was formed.

Sample 37 was made in the same way as in the sample 31 except for the layer 4 comprising crystalline silicon and amorphous silicon in a mixed manner. Instead of the layer 4 comprising crystalline silicon and amorphous silicon in a mixed manner, a n-type crystalline silicon layer was formed 400 nm thick over the silicon particles 3 and the insulating layer 2.

Figure 5:
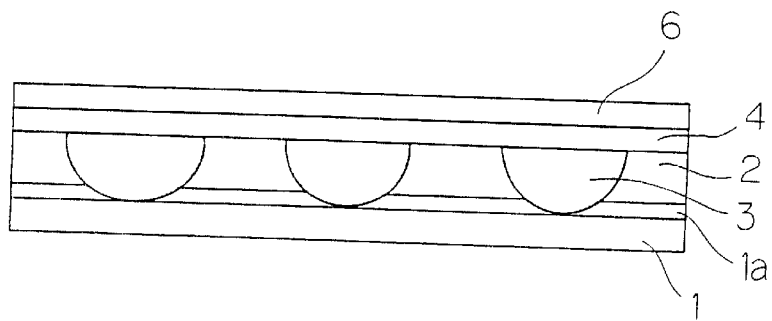
FIG. 5 is a cross-sectional view of a photoelectric conversion device according to a comparative example.

A cross-sectional view of sample 38 is shown in FIG. 5. In the sample 38, after silicon particles 3 were sunk into an insulating layer 2 so as to be contacted with an aluminum layer 1a in the same way as in the sample 31, portions of the silicon particles 3 that protruded from the insulating layer 2 were ground and flattened. Then, a layer 4 comprising crystalline silicon and amorphous silicon in a mixed manner was formed 200 nm thick on the flattened silicon particles 3 and the insulating layer 2, on which a silicon nitride film was formed as a protective film 6.

The conversion efficiency was measured after irradiating light vertically to the samples 31–38 (five sets were prepared for each) made in the above-mentioned manner. The result is shown in Table 3.

TABLE 3

| Sample No. | n-layer structure | n-layer thickness (nm) | Transparent conductive film | Conversion efficiency (%) |
| --- | --- | --- | --- | --- |
| 31 | Crystalline-amorphous mixed | 200 | None | 11.3 |
| 32 | Crystalline-amorphous mixed | 200 | None | 11.2 |
| 33 | Crystalline-amorphous mixed | 200 | None | 11.4 |
| 34 | Crystalline-amorphous mixed | 200 | None | 11.3 |
| 35 | Crystalline-amorphous mixed | 150 | ITO | 11.3(-)* |
| 36 | Amorphous | 150 | ITO | 1.4 |
| 37 | Crystalline | 400 | None | 10.8 |
| 38 | Crystalline-amorphous mixed | 200 | None | 11.2 |

*The mark (-) indicates that there was a sample on which measurement was impossible due to occurrence of leakage.

The conversion efficiency of the sample 35 adopting a semiconductor layer comprising a crystalline semiconductor and an amorphous semiconductor in a mixed manner was improved when compared with that of the sample 36 adopting an amorphous semiconductor layer. The sample 31 had conversion efficiency as good as that of the sample 35. In the sample 35, however, two out of five sets suffered leakage between the transparent conductive film and the silicon particles, which made measurement of the conversion efficiency impossible.

In the case of the sample 31 where the semiconductor layer 4 comprising a mixture of crystalline semiconductor and an amorphous semiconductor was used, the conversion efficiency was improved when compared with that of the sample 37 where a crystalline semiconductor layer was used.

Although the structure of the substrate was varied from that of the sample 31 in the samples 32–34, the conversion efficiencies thereof were around the rate of the sample 31, which proved that any of the substrate structures can be adopted as long as it is conductive.

Finally, the sample 38, in which the portions of the silicon particles protruding from the insulating layer were ground and flattened as shown in FIG. 5, exhibited conversion efficiency at the same level as that of the sample 31 when light was irradiated vertically.

A result obtained when the samples 31 and 38 were measured again after being irradiated by light incident at a 45 degree angle is shown in Table 4.

TABLE 4

| Sample No. | n-layer structure | n-layer thickness (nm) | Transparent conductive film | Conversion efficiency (%) |
|---|---|---|---|---|
| 31 | Crystalline | 200 | None | 10.7 |
| 38 | Crystalline | 200 | None | 6.5 |

Having the flattened surface, the sample 38 was heavily dependant on the light incidence angle, which resulted in the largely decreased conversion efficiency. On the other hand, the sample 31 having the curved surface (irregular surface) had little dependence on the light incidence angle, so that the decease in the conversion efficiency was small. The sample 31 was thus proven to be excellent.

Example B2

Conversion efficiency was measured on a plural number of samples having a mixture layer 4 comprising a crystalline silicon and an amorphous silicon, in which the mixture layer 4 was made in the same way as in the sample 31 and the thickness thereof was varied. The result is shown in Table 5.

TABLE 5

| n-layer thickness (nm) | Conversion efficiency (%) |
|---|---|
| 30 | 9.9 |
| 50 | 10.6 |
| 100 | 11.0 |
| 200 | 11.2 |
| 300 | 10.6 |
| 400 | 10.1 |
| 500 | 9.3 |

As is apparent from Table 5, the thickness of the mixture layer (n-layer) 4 should be in the range of 50–400 nm in order to obtain conversion efficiency of 10% or more. The conversion efficiency is good when the thickness is in the range of 50–400 nm.

Conversion efficiency decreases when the thickness is less than 50 nm. This is considered attributable to increase of the series resistance caused by increase of the resistance of the n-layer. In the case of the thickness larger than 400 nm, the conversion efficiency decreases. This may be explained that the quantity of the light transmitted onto the aluminum layer has been reduced in the area where silicon particles are not present due to lowered light transmittance efficiency of the n-layer.

It has been confirmed from the example above that, according to the present invention, a photoelectric conversion device with good conversion efficiency can be realized even without forming a transparent conductive film.

<Embodiment C>

Figure 6:
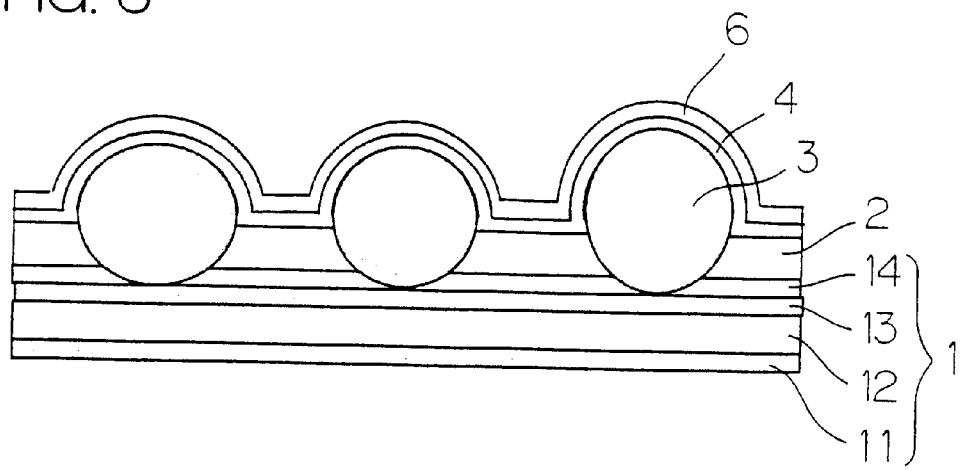
FIG. 6 is a cross-sectional view showing a photoelectric conversion device according to the present invention.

FIG. 6 is a cross-sectional view showing a photoelectric conversion device according to the present invention.

In FIG. 6, numerals 11–14 denote layers constituting a substrate 1. A first aluminum-iron alloy layer, an iron layer, a second aluminum-iron alloy layer, and an aluminum layer are denoted by 11, 12, 13, and 14, respectively. The aluminum layer 14 functions as the other electrode.

An aluminum-iron alloy layer 11 with an element such as C, N, O, Mg, Si, Mn, or Cr being added thereto by 20% or so has an effect similar to that of this invention. This also applies to the iron layer 12, the aluminum-iron alloy layer 13, and the aluminum layer 14.

Preferably, the thickness of the aluminum-iron alloy layer 11 is not less than 2 μm nor more than 100 μm. When the thickness is less than 2 μm, the aluminum-iron alloy layer incurs insufficient weather resistance, and when the thickness is more than 100 μm, it is fragile resulting in poor reliability.

Thicknesses preferred for the iron layer are 5 μm or more. When the thickness is less than 5 μm, fusion-bonding between the aluminum and the crystalline semiconductor particles can not be restricted.

The aluminum layer 14 is contacted with the crystalline semiconductor particles 3 so as to realize low-temperature junction and low-resistance electrode. The thickness of the aluminum layer 14 regulates the junction between the aluminum layer and the crystalline semiconductor particles 3. The thickness of the aluminum layer 14 should preferably be not less than 5 μm nor more than half the average particle diameter of the crystalline semiconductor particles. The aluminum layer suffers shortage of contact with the crystalline semiconductor particles 3 when the thickness is less than 5 μm. When the layer thickness is more than half the average particle diameter of the crystalline semiconductor particles 3, the junction becomes extremely large, which is inappropriate.

The first aluminum-iron alloy layer 11, the iron layer 12, the second aluminum-iron alloy layer 13, and the aluminum layer 14 can be made by applying a heat treatment to a substrate consisting of a first aluminum layer, an iron layer, and a second aluminum layer. Although the aluminum-iron alloy layer can be formed at a temperature of 500° C. or higher, preferred temperatures for forming it are in the range of 570° C.–650° C. The heating time is from 3 to 20 minutes.

When another heat treatment is necessary in another process, the designed aluminum-iron alloy layer is first formed by heating followed by cooling down to 550° C. or below, and then, heating is carried out again. This makes it possible to prevent the aluminum-iron alloy layer from growing beyond the required degree. This is because the melting point of the aluminum-iron alloy layer is higher than that of aluminum.

It is desirable for the first aluminum-iron alloy layer 11 to be thinner than the second aluminum-iron alloy layer, and not to include the aluminum layer remaining beneath it. In order to transform the first aluminum layer entirely into the aluminum-iron alloy layer 11, the thickness of the first aluminum layer before heating should be less than the thickness of the second aluminum layer. More desirably, the thickness of the first aluminum-iron alloy layer 11 should be not more than half the thickness of the second aluminum-iron alloy layer nor less than 2 μm.

The insulating layer 2 comprises an insulating material for separating the positive electrode from the negative electrode. The insulating material may comprise, for example, glass slurry composed of components arbitrarily selected from among $SiO_2$, $Al_2O_3$, PbO, $B_2O_3$, ZnO, MgO and the like. The insulator 2 needs to have some degree of hardness or viscosity when placed on the substrate 1 so as to temporarily hold the semiconductor particles 3 pressed thereinto. In addition, it needs to have a characteristic capable of partly covering the semiconductor particles 3 by melting at a temperature of heat applied thereto for creating ohmic contact between the substrate 1 and the semiconductor particles 3.

The first conductive-type semiconductor particles 3 comprise Si, Ge, and a small amount of p-type impurity such as B, Al and the like, or n-type impurity such as P, As and the like. The shapes of the semiconductor particles 3 may be polygons or curved surfaces. Preferably, they should comprise curved surfaces, especially spherical shapes so that they efficiently push the insulating layer 2 aside when they are pressed from above the insulating layer 2 into the insulating layer 2 until they come into contact with the substrate 1.

The particle diameters may be even or uneven. However, uneven particle diameters will be advantageous in terms of cost, because an additional process is necessary in order to uniformize the particle diameters.

Incidentally, the semiconductor particles 3 will be brought into sufficient contact with the substrate 1 even when the particle diameters are uneven by using a pressing jig made of a flexible material for pressing the semiconductor particles 3 from above the insulating layer 2 so as to be brought into contact with the substrate 1. Furthermore, having convex surfaces makes the dependence on the light incidence angle small.

The second conductivity-type crystalline semiconductor layer 4 functioning also as the other electrode is formed by the vapor-phase growth method or the like, in which, for example, a vapor-phase phosphorous system compound that is a n-type impurity or a vapor-phase boron system compound that is a p-type impurity is added in a small amount to a vapor-phase silane compound. The crystalline semiconductor layer 4 only needs to comprise a monocrystal semiconductor, a polycrystalline semiconductor or a microcrystalline semiconductor. It is not necessary to additionally provide a transparent conductive film, because the crystalline semiconductor layer 4 functions also as an electrode. Accordingly, the process can be simplified allowing further cost reduction.

In view of the conductivity, the concentration of the microelement in the semiconductor layer 4 may be high, for example, from $1\times10^{16}$ atm/cm$^3$ to $1\times10^{22}$ atm/cm$^3$.

Preferably, the protective film 6 should have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the crystalline semiconductor layer 4. Transparency is necessary for the protective film 6, because it is in contact with the surface where the light is incident. The protective film 6 also serves to prevent current from leaking. Incidentally, optimizing the thickness of the protective film 6 will enable it to serve as an anti-reflection film.

Moreover, it is also possible to provide a patterned electrode comprising fingers and bus bars at regular intervals on the semiconductor layer 4 or on the protective film 6 so as to lower the series resistance, thereby improving the conversion efficiency.

EXAMPLE C

First, an insulating layer 2 was formed on a substrate 1. A first aluminum layer, an iron layer and a second aluminum layer were rolled at room temperature and bonded together so as to form a substrate to be used as the initial substrate. The insulating layer 2 was formed 50 μm thick on the substrate 1 by using glass paste. The softening temperature of the glass used for the glass paste was 480° C.

Then, p-type silicon particles with an average diameter of 150 μm were densely deposited on the insulating layer. The sample was heated at 600° C. so that the silicon particles sank into the insulating layer until they came into contact with the aluminum layer. By this heating, a first aluminum-iron alloy layer, an iron layer, a second aluminum-iron alloy layer, and an aluminum layer were formed within the substrate.

A result of evaluation of the reliability, which was obtained by changing the thicknesses of the first or second aluminum-iron alloy layers, is shown in Table 6 (Samples 41–50). The thicknesses of the first or second aluminum-iron alloy layers were adjusted by modifying the heating time and the thicknesses of the first or second aluminum layers in the substrate before the heating. Subsequently, a n-type crystalline silicon layer 4 was formed 400 nm thick over the silicon particles 3 and the insulating layer 2, on which a silicon nitride film was further formed 500 nm thick as a protective film 6.

TABLE 6

| Sample No. | Thickness of first or second aluminum-iron alloy layers (μm) | Reliability |
| --- | --- | --- |
| 41 | 2 | ◯ |
| 42 | 5 | ◯ |
| 43 | 10 | ⊙ |
| 44 | 15 | ⊙ |
| 45 | 20 | ⊙ |
| 46 | 50 | ⊙ |
| 47 | 100 | ◯ |
| 48 | 0 | X |
| 49 | 1 | Δ |
| 50 | 150 | Δ |

The reliability was evaluated after exposing each sample to a 85° C., 95% RH atmosphere for 2000 hours. The surface and a cross-section of each sample were observed. Samples having been significantly oxidized were marked by X, samples having been partially oxidized were marked by Δ, samples with little oxidization were marked by ◯, and samples with no oxidization were marked by ⊙.

As is apparent from the Table 6, samples having 2 μm or more thick first or second aluminum-iron alloy layers, namely, the samples 41–47 had good reliability. The samples 41–47 correspond to an embodiment of the present invention. The 2 μm or more thick first or second aluminum-iron alloy layers correspond to a 1.5 μm thick aluminum layer in the initial substrate.

Figure 7:
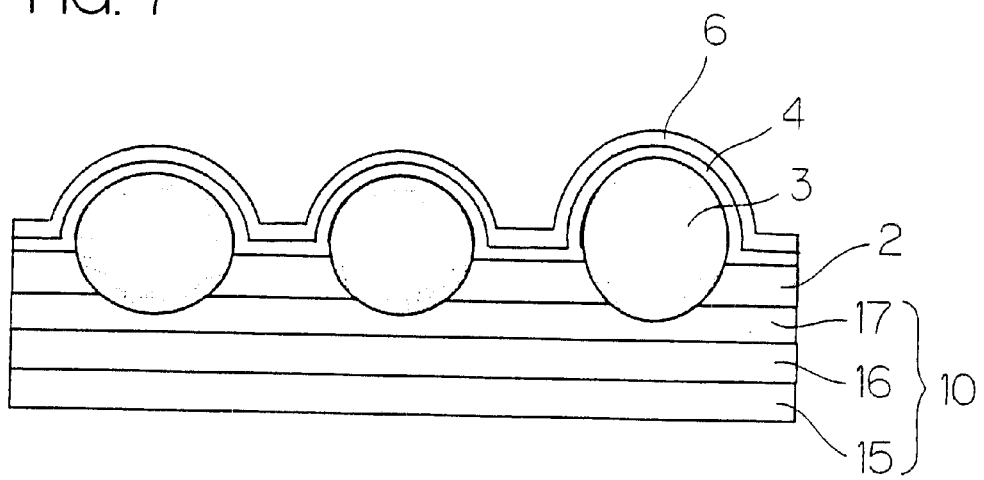
FIG. 7 is a cross-sectional view of a photoelectric conversion device according to a comparative example.

Then, as a comparative example, a substrate 10 in which a first aluminum layer 15, an iron layer 16 and a second aluminum layer 17 were sequentially formed as shown in FIG. 7 was used to make samples 50–54. Other conditions were the same as those in the sample 41. A result of evaluation of the reliability of these samples is shown in Table 7.

TABLE 7

| Sample No. | Thickness of first and second aluminum-iron alloy layers (μm) | Reliability |
| --- | --- | --- |
| 50 | 0 | X |
| 51 | 5 | X |
| 52 | 10 | Δ |
| 53 | 100 | Δ |
| 54 | 300 | ○ |

Table 7 explains that good reliability could be obtained only when the thicknesses of the first or second aluminum layers 15, 17 were as large as 300 μm. When this is compared with the result in Table 6 where the aluminum-iron alloy layer was used, the layer thickness needs to be extremely large. That is, since the aluminum layer thickness should be 300 μm or more in this case, the average particle diameter of the crystalline semiconductor particles 3 needs to be 600 μm or more in order to permit control of the junction. This completely prevents downsizing of the crystalline semiconductor particles that is necessary for lowering the cost.

On the other hand, when the first or second aluminum-alloy layers are formed according to this invention, the thicknesses of the first or second aluminum-iron layers only need to be 2 μm or more so that the requisite thickness of the aluminum layer for forming the junction is freely designable (Samples 41–47).

Subsequently, the reliability was evaluated by using samples in which the first aluminum layer was 1.5 μm thick and the second aluminum layer was 100 μm thick before heating. The thicknesses of the first or second aluminum-iron alloy layers were varied by changing the heating time. A result of the evaluation is shown in Table 8 (Samples 55–59).

TABLE 8

| Sample No. | Thickness of first aluminum-iron alloy layer (μm) | Thickness of second aluminum-iron alloy layer (μm) | Reliability |
| --- | --- | --- | --- |
| 55 | 0 | 0 | X |
| 56 | 1 | 1 | Δ |
| 57 | 2 | 2 | ○ |
| 58 | 2 | 3 | ○ |
| 59 | 2 | 4 | ⊙ |

As is understood from Table 8, good reliability was obtained when the thickness of the second aluminum-iron alloy layer was larger than that of the first aluminum-iron alloy layer. The reason for this may be explained that the aluminum layer did not remain beneath the first aluminum-iron alloy layer or that the first aluminum-iron alloy layer was more strongly reformed. The samples 57–59 correspond to an embodiment of this invention.

<Embodiment D>

Figure 8:
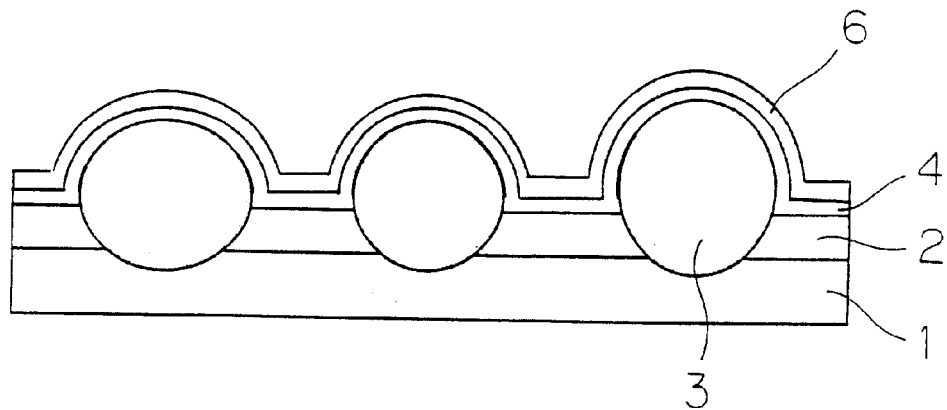
FIG. 8 is a cross-sectional view showing a photoelectric conversion device according to the present invention.
Figure 9:
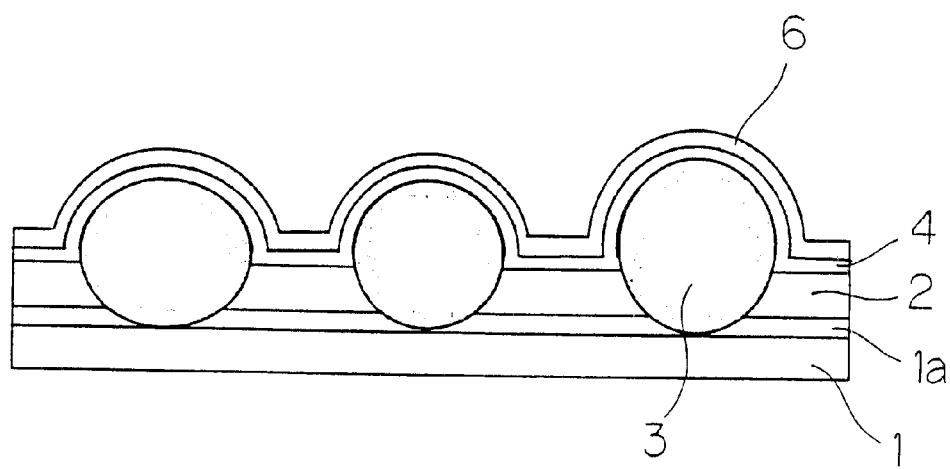
FIG. 9 is a cross-sectional view showing a photoelectric conversion device according to the present invention.

FIG. 8 is a cross-sectional view of an embodiment of the photoelectric conversion device according to the present invention. FIG. 9 illustrates another embodiment of the photoelectric conversion device according to the present invention.

FIGS. 8 and 9 show a substrate 1, an insulator 2, first conductivity-type semiconductor particles 3, a semiconductor layer 4 comprising a crystalline semiconductor and an amorphous semiconductor in a mixed manner, and a protective film 6.

The substrate 1 comprises metal, ceramics, or resin. The substrate 1 may be any one as long as it has conductivity, because it serves also as the lower electrode. When the substrate is made of metal, the substrate comprises a metal layer, or a combination of layers of different metals. When the substrate 1 is made of an insulator such as ceramics or resin, a conductive layer 1a as shown in FIG. 9 needs to be formed on the surface of the substrate 1. The requisite characteristic for this conductive layer 1a is the same as in the case of a metal substrate.

The first conductivity-type crystalline semiconductor particles 3 comprise Si and Ge, and a small amount of p-type impurity such as B, Al, and Ga, or n-type impurity such as P and As.

The shapes of the semiconductor particles 3 may comprise polygons, curved surfaces or the like. Preferably, they should comprise curved surfaces, especially spherical shapes so that they efficiently push the insulating layer 2 aside when they are pressed from above the insulating layer 2 into the insulating layer 2 until they come into contact with the substrate 1. The particle diameters may be even or uneven. However, uneven particle diameters will be advantageous to make the device less expensive, because an additional process is necessary in order to uniformize the particle diameters. Incidentally, the semiconductor particles will be brought into sufficient contact with the substrate 1 even when the particle diameters are uneven by using a pressing jig made of a flexible material for pressing the semiconductor particles 3. Furthermore, having convex surfaces reduces dependence on the light incident angle. Preferably, the particle diameters should be in the range of 10–500 μm. Particles with diameters less than 10 μm are unfavorable because they cause the insulating layer 2 to adhere to the pressing jig for pressing the particles, thereby contaminating the surfaces of semiconductor particles 3. Also, using semiconductor particles with diameters exceeding 500 μm makes no difference in the amount of the semiconductor material to be used from the amount used in conventional flat plate photoelectric conversion devices, which neutralizes the material-saving advantage of using spherical particles.

The insulator 2 is provided for separating the positive electrode from the negative electrode. The insulator may comprise, for example, glass slurry composed of components arbitrarily selected from among $SiO_2$, $B_2O_3$, $Al_2O_3$, CaO, MgO, $P_2O_5$, $Li_2O$, $SnO_2$, PbO, ZnO, and the like. The insulator 2 needs to have some degree of hardness or viscosity when placed on the substrate 1 so as to temporarily hold the semiconductor particles 3 pressed thereinto. In addition, it needs to have a characteristic capable of partly covering the semiconductor particles 3 by melting at a temperature of heat applied thereto for creating ohmic contact between the substrate 1 and the semiconductor particles 3 as mentioned later.

What is important here is to tentatively form the insulator 2 on the substrate 1 before creating ohmic contact by pressing the semiconductor particles 3 into the substrate 1. In this way, the upper surfaces of the semiconductor particles 3 do not need to be covered with the insulator 2 so that the semiconductor particles 3 can be contacted with the substrate 1 and the semiconductor layer 4 without being contaminated. Accordingly, a mechanical treatment such as grinding the upper surfaces of the semiconductor particles 3 is no longer necessary after formation of the junction.

The insulator 2 here is one that satisfies $V1 \times \rho1 \geq V2 \times \rho2$, which represents the relation in weight between the semiconductor particles 3 and the insulator 2 (V1: volume of one crystalline semiconductor particle, V2: volume of one crystalline semiconductor particle in the part being buried in the insulator, $\rho1$: specific gravity of the crystalline semiconductor particles, $\rho2$: specific gravity of the insulator).

The above formula is originally supposed to be $\alpha1 \times v1 \times \rho1 \geq \alpha2 \times v2 \times \rho2$ ($\alpha1$: ratio of the volume of the crystalline semiconductor particles at room temperature to that at the junction temperature, $\alpha2$: ratio of the volume of the insulator at room temperature to the volume of the fused or partly fused insulator at the junction temperature). However, concerning $\alpha1$, the linear expansion coefficient of the crystalline semiconductor particles is from $2 \times 10^{-6}/°$ C. to $6 \times 10^{-6}/°$ C., which brings $\alpha1$ being $1+(2\sim50\times10^{-9})$ when considered in volume. $\alpha1$ is therefore nearly equal to ($\approx$) 1. $\alpha2$ is estimated based on the expansion rate of the insulator obtained from its volume at room temperature and the volume thereof when fused or partly fused at the junction temperature, and is $1+(10^{-10})$ at the largest. As a result, $\alpha2$ is also nearly equal to ($\approx$) 1, which makes it possible to consider that approximately $\alpha1=\alpha2=1$, thereby allowing the use of the above formula ($V1 \times \rho1 \geq V2 \times \rho2$).

When the specific gravity of the insulator 2 is far higher than that of the semiconductor particles 3, buoyancy is generated in the semiconductor particles 3 when the insulator 2 fuses at the heating temperature applied for creating ohmic contact between the semiconductor particles 3 and the substrate 1. Due to the buoyancy, the semiconductor particles 3 float in the fused insulator 2 making ohmic contact between the semiconductor particles 3 and the substrate 1 impossible.

Therefore, in order to prevent generation of buoyancy in the semiconductor particles 3 in the insulator 2, it is important to regulate the relation in weight between the semiconductor particles 3 and the insulator 2 as the above formula ($V1 \times \rho1 \geq V2 \times \rho2$), in which the relation is regulated such that the weight of the insulator 2 with a volume corresponding to the volume V2 of the semiconductor particles 3 that are included in the insulator 2 is not more than the weight of the semiconductor particles 3.

Specific numbers are hereinafter referred to. In order to utilize the upper hemisphere surfaces of the semiconductor particles 3 for the PN-junction, the specific gravity of the insulator required when the semiconductor particles 3 are buried in the insulator 2, for example, by ½ of their volume, is not more than twice the specific gravity of the semiconductor particles 3.

To take semiconductor particles 3 which mainly comprise Si (specific gravity: $\rho=2.33$ g/cm$^3$) as an example, the specific gravity $\rho$ of the insulator 2 should only be not more than 4.66 g/cm$^3$. As the insulator 2 which satisfies this condition, there are SiO$_2$ ($\rho=2.65$ g/cm$^3$, m.p.1800° C.), B$_2$O$_3$ ($\rho=1.84$ g/cm$^3$, m.p.577° C.), Al$_2$O$_3$ ($\rho=3.96$ g/cm$^3$, m.p.2050° C.), CaO ($\rho=3.37$ g/cm$^3$, m.p.2572° C.), MgO ($\rho=3.65$ g/cm$^3$, m.p.2800° C.), P$_2$O$_5$ ($\rho=2.39$ g/cm$^3$, m.p.360° C.), Li$_2$O ($\rho=2.01$ g/cm$^3$, m.p.1700° C.), and the like. Any of these materials may be arbitrarily selected and used as the main component for the insulator 2. Here, "m. p." denotes the melting point.

Compared with the materials above, PbO ($\rho=9.53$ g/cm$^3$, m.p.888° C.), SnO ($\rho=6.44$ g/cm$^3$, m.p.700° C.), ZnO ($\rho=5.61$ g/cm$^3$, m.p.1975° C.) and BaO ($\rho=5.72$ g/cm$^3$, m.p.1923° C.) are too heavy to be used as the main component, but may be used in combination with one of the materials above so that the specific gravity of the insulator 2 becomes 4.66 g/cm$^3$ or less.

Meanwhile, the fusion point of the insulator 2 needs to be less than the temperature at which ohmic contact is created between the substrate 1 and the semiconductor particles 3. In the case of using Si as the main component of the semiconductor particles 3, and Al as the material for the surface of the substrate 1, the ohmic contact temperature is above 577° C. This means that a single component selected from the components above, for example, SiO$_2$, which is mentioned in the aforementioned Japanese Patent No. 2641800, cannot form the insulator 2 by the method according to this invention due to its high melting point. Using a plurality of components selected arbitrarily from among the materials above enables the fusion point of the insulator 2 to be below the temperature at which ohmic contact occurs between the substrate 1 and the semiconductor particles 3.

In addition, even in the case of using a material with a heavy specific gravity, including one of the materials listed above that has a specific gravity of less than 4.66 g/cm$^3$ as a filler makes the specific gravity as a whole to be not more than 4.66 g/cm$^3$, which solves the problem of buoyancy. Materials such as SiO$_2$, Al$_2$O$_3$, CaO, MgO, TiO$_2$ ($\rho=4.2$ g/cm$^3$, m.p.1855° C.) and the like may be used solely or in combination as the filler.

The "main material" here refers to a material that fuses at the heat treatment temperature losing its initial shape, and hardens by cooling so as to form a glass structure of an insulating layer. On the other hand, the "filler" refers to a material or particles that do not fuse at the heat treatment temperature almost holding the initial shape, and remain in the glass structure of the insulating layer being mixed therein.

The second conductivity-type semiconductor layer 4 may be of any kind as long as it comprises a crystalline semiconductor and an amorphous semiconductor in a mixed manner, and is formed by the vapor-phase growth method or the like, in which, for example, a vapor-phase phosphorous system compound that is a n-type impurity or a vapor-phase boron system compound that is a p-type impurity is added in a small amount to a vapor-phase silane compound. The light transmittance of the semiconductor layer 4 comprising a crystalline semiconductor and an amorphous semiconductor in a mixed manner, which is higher when compared with that of an amorphous semiconductor layer, permits the film to be thickened.

A part of the incident light passes through the semiconductor layer 4 comprising a crystalline semiconductor and an amorphous semiconductor in a mixed manner at the area where the semiconductor particles 3 are not present and is reflected by the substrate 1 and directed at the semiconductor particles 3. This enables the light energy being transmitted in the whole photoelectric conversion device to be efficiently transmitted to the semiconductor particles 3. In addition, since the semiconductor layer 4 comprising a crystalline semiconductor and an amorphous semiconductor in a mixed manner also functions as an electrode, it is not necessary to additionally form a transparent conductive film. The manufacturing process is thus simplified allowing further cost reduction. If a transparent conductive film is formed as an electrode in defective portions generated during formation of the semiconductor layer 4 comprising a crystalline semiconductor and an amorphous semiconductor in a mixed manner, leakage will occur between the transparent conductive film and the semiconductor particles 3 located under the defective portions in the semiconductor layer 4 comprising a crystalline semiconductor and an amorphous semiconductor in a mixed manner, which is a problem.

The concentration of the microelement in the semiconductor layer 4 may be high when considered in view of the conductivity, which is, for example, from $1\times10^{16}$ to $1\times10^{21}$ atm/cm$^3$. Preferably, the semiconductor layer 4 comprising a crystalline semiconductor and an amorphous semiconductor in a mixed manner should be formed along the surfaces of the semiconductor particles 3 so that the PN-junction is formed in the vicinity of the surface where light is incident as well as along the convex contours of the semiconductor particles 3. A wide area will be made available for the PN-junction by forming the semiconductor layer 4 along the convex contours of the semiconductor particles 3 so that carriers generated within the semiconductor particles 3 can be collected efficiently. In addition, the material for a crystalline semiconductor layer 4 and that for a semiconductor layer 4 comprising a crystalline semiconductor and an amorphous semiconductor in a mixed manner are more stable than the material for an amorphous semiconductor layer. High reliability is therefore expected.

It is desirable for the protective film 6 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, SiO$_2$—TiO$_2$, tantalum oxide, yttrium oxide are used to form a single layer or a combined layer on the semiconductor layer 4 comprising a crystalline semiconductor and an amorphous semiconductor in a mixed manner. The protective film 6 needs to be a transparent dielectric because transparency is necessary for a protective film being in contact with the surface where the light is incident. The protective film 6 is also necessary for preventing leakage from occurring between the upper part including the protective film 6 and the semiconductor particles 3 located under defective portions of the semiconductor layer 4 comprising a crystalline semiconductor and an amorphous semiconductor in a mixed manner. Incidentally, optimizing the thickness of the protective film 6 will enable it to function as an anti-reflection film.

Moreover, it is also possible to provide a patterned electrode comprising fingers and bus bars at regular intervals on the semiconductor layer 4 comprising a crystalline semiconductor and an amorphous semiconductor in a mixed manner or on the protective film 6 so as to lower the series resistance, thereby improving the conversion efficiency.

EXAMPLE D

A cross-section of a photoelectric conversion device for samples 61–78 is shown in FIG. 9. An aluminum layer 1a was formed 10 μm thick on a substrate 1 comprising iron, on which an insulator 2 was formed such that the thickness thereof after calcination becomes 100 μm. The insulator was made by using each of the glass frits listed in Table 9 with which a cellulosic binder and a solvent, which is calbitol, were mixed. P-type silicon particles 3 with an average particle diameter of 250 μm were then deposited densely on the insulator and pressed into the insulator 2 until they come in contact with the aluminum layer 1a. Subsequently, in order to bond the silicon particles 3 to the aluminum layer 1a, the insulator 2 was heated at a temperature of 577° C. or above so as to be fused. The condition of the junction between the silicon particles 3 and the aluminum layer 1a was checked out, of which result is shown in Table 9.

TABLE 9

| Sample No. | Insulator material | Filler | Specific gravity of insulator (g/cm$^3$) | Softening temperature of insulator (° C.) | Formation of the junction | Insulator condition |
|---|---|---|---|---|---|---|
| 61 | Li2O.SnO | — | 2.8 | 549 | Formed | Fused |
| 62 | SiO2.BaO.Li2O | — | 2.9 | 553 | Formed | Fused |
| 63 | SiO2.B2O3.ZnO | — | 3.2 | 575 | Formed | Fused |
| 64 | P2O5.ZnO.CaO | — | 3.4 | 400 | Formed | Fused |
| 65 | SiO2.B2O3.Al2O3.PbO | — | 3.7 | 500 | Formed | Fused |
| 66 | P2O5.ZnO.SnO | — | 3.8 | 450 | Formed | Fused |
| 67 | SiO2.PbO | — | 4.1 | 550 | Formed | Fused |
| 68 | B2O3.SiO2.PbO | SiO2 | 4.4 (5.6) | 405 | Formed | Fused |
| 69 | B2O3.ZnO.PbO | Al2O3 | 4.5 (5.2) | 470 | Formed | Fused |
| 70 | B2O3.ZnO.PbO | CaO | 4.5 (5.2) | 470 | Formed | Fused |
| 71 | B2O3.ZnO.PbO | MgO | 4.6 (5.2) | 470 | Formed | Fused |
| 72 | B2O3.ZnO.PbO | TiO2 | 4.6 (4.9) | 450 | Formed | Fused |
| 73 | B2O3.SiO2.PbO | | 4.9 | 450 | Not formed | Fused |
| 74 | SiO2.PbO | | 5.2 | 470 | Not formed | Fused |
| 75 | PbO.B2O3.Al2O3 | | 5.6 | 405 | Not formed | Fused |
| 76 | SiO2.B2O3.PbO | | 6.2 | 390 | Not formed | Fused |
| 77 | SiO2.PbO | | 3.5 | 650 | Formed | Unfused |
| 78 | SiO2 | | 2.7 | 1800 | Formed | Unfused |

The chemical symbols of the materials for the insulator in each column of this table are shown in descending order in terms of content. The values in the parentheses in the column of the insulator specific gravity are the gravities of the main materials used in the filler-containing samples.

In the case of samples 73–76, it is speculated that the specific gravities of the insulators were so large that the silicon particles 3 could not contact with the aluminum layer 1a and that the silicon particles 3 floated while the insulator 2 was fused.

Regarding the samples 77 and 78, since buoyancy was not generated in the silicon particles 3, they were brought into contact with the aluminum layer 1a. However, due to the softening temperature of the insulator 2 that is higher than the heat treatment temperature, the insulator remained in an unfused state making the sample fragile, and as a result, the silicon particles 3 were detached from the aluminum layer 1a.

On the other hand, in the case of the samples 61–67, buoyancy was not generated in the silicon particles 3, which made the silicon particles 3 successfully come in contact with the aluminum layer 1a. The softening temperature of the insulator 2 lower than the heat treatment temperature enabled the insulator 2 to be fused. In addition, the surfaces of the silicon particles 3 were not contaminated with the insulating material. The samples were therefore made in good order.

In the samples 68–72, mixing a filler with a small specific gravity lowered the specific gravity of the entire insulator 2 to the desired rate, thereby allowing the samples to be as good as the samples 61–67. Meanwhile, the same effect was attained when a single aluminum substrate (FIG. 8) was used as the substrate.

Figure 10:
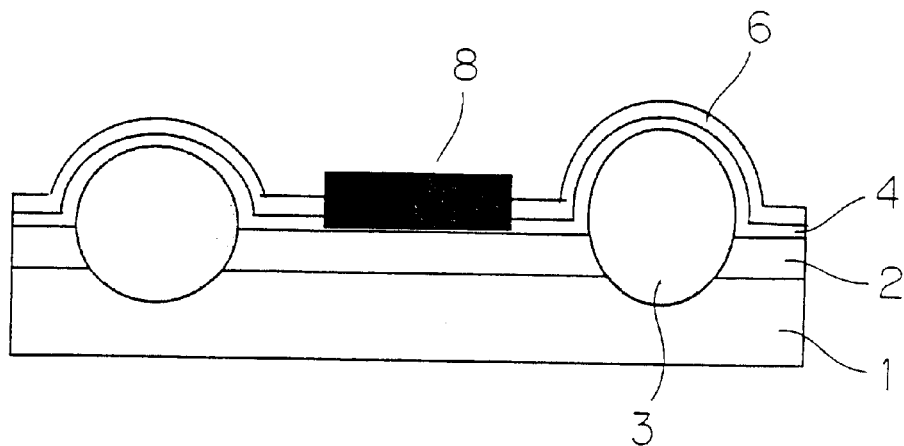
FIG. 10 is a cross-sectional view showing a photoelectric conversion device according to the present invention.

As a result of the discussion above, the samples 61–72 are an embodiment of this invention.
<Embodiment E>
FIG. 10 is a cross-sectional view showing an embodiment of the photoelectric conversion device according to the present invention.

FIG. 10 shows a substrate 1, an insulator 2, first conductivity-type semiconductor particles 3, a second conductivity-type semiconductor area 4, a protective film 6, and the other electrode 8.

The substrate 1 serves as the electrode of one side and comprises metal, ceramics, or resin. When the substrate 1 is made of an insulator such as ceramics or resin, a conductive layer such as an aluminum layer needs to be formed on the surface of the substrate.

The crystalline semiconductor particles 3 are deposited in a great number on the substrate 1. The first conductivity-type crystalline semiconductor particles 3 comprise Si, Ge, and a small amount of p-type impurity as a microelement such as B, Al, or Ga.

The shapes of the semiconductor particles 3 may comprise polygons, curved surfaces or the like. The particle diameters may be even or uneven. However, uneven particle diameters will be advantageous to make the device less expensive, because an additional process is necessary in order to uniformize the particle diameters. Having convex surfaces reduces the dependence on the light incidence angle, which is also advantageous.

An insulator 2 is disposed among the crystalline semiconductor particles 3. The insulator 2 comprises an insulating material for separating the positive electrode from the negative electrode. The insulator may comprise, for example, glass slurry composed of components arbitrarily selected from among $SiO_2$, $Al_2O_3$, PbO, ZnO, $B_2O_3$, MgO and the like. The insulator 2 needs to have some degree of hardness or viscosity when placed on the substrate 1 so as to temporarily hold the semiconductor particles 3 pressed thereinto.

The second conductivity-type area 4 is formed on the fist conductivity-type crystalline semiconductor particles 3. The second conductivity-type area 4 is formed in a laminated manner by the vapor-phase growth method or the like, in which, for example, a vapor-phase phosphorous system compound that is a n-type impurity is added in a small amount to a vapor-phase silane compound. The layer to be formed as the second conductivity-type area 4 may be monocrystal, polycrystalline, microcrystalline, or amorphous. In this case, the concentration of the microelement contained in the layer should be, for example, from $1 \times 10^{16}$ to $1 \times 10^{22}$ atm/cm$^3$. This second conductivity-type area 4 may also be formed such that a second conductivity-type microelement is injected over the fist conductivity-type crystalline semiconductor particles 3 by ion implantation or the thermal diffusion method, and then the entire surface is covered with a transparent conductive film.

A protective film 6 is formed on the second conductivity-type area 4. It is desirable for the protective film 6 to have the properties of a transparent dielectric. It is formed by the CVD method, the PVD method or the like, in which, for example, one or a plurality of materials selected from among silicon oxide, cesium oxide, aluminum oxide, silicon nitride, titanium oxide, $SiO_2$—$TiO_2$, tantalum oxide, yttrium oxide are used to form a single layer or a combined layer on the second conductivity-type area 4. Being in contact with the surface where light is incident, the protective film 6 needs to have transparency.

The other electrode 8 is formed by bringing it into contact with the second conductivity-type area 4 after a part of the protective film 6 is removed. The other electrode 8 is formed on the insulating layer 2 such that the area of the electrode 8 under which the crystalline semiconductor particles 3 are present is not more than 10% of the entire area of the electrode 8, so that the photoelectric conversion device has high conversion efficiency. In other words, when the area of the electrode 8 under which the semiconductor particles 3 are present exceeds 10% of the whole area of the electrode 8, the conversion efficiency deteriorates.

The other electrode 8 is formed by deposition, plating, or printing. When it is formed by printing, silver paste including silver powder, glass powder and an organic binder mixed therewith is used as the material, which is subjected to screen printing followed by a heat treatment. In order to reduce the series resistance, it is possible to subject the electrode that has been subjected to printing and calcination to a copper or tin plating, and then cover it by soldering. Or, silver paste may be screen printed on the deposited protective film 6 and heat-treated at a high temperature (for example, 850° C.) so that an electrode is formed through the protective film 6.

Figure 11:
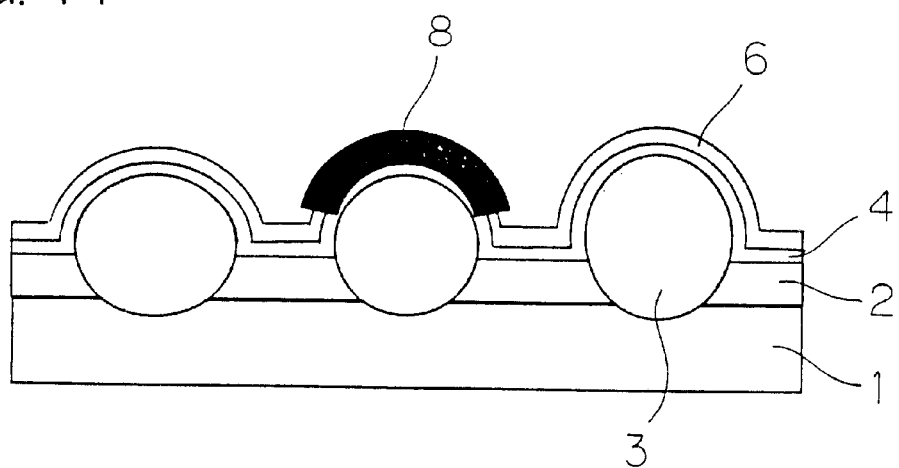
FIG. 11 is a cross-sectional view of a photoelectric conversion device according to a comparative example.

A comparative example in which the other electrode 8 is formed above the crystalline semiconductor particles 3 is shown in FIG. 11. In the case of forming the other electrode 8 above the crystalline semiconductor particles 3, when the second conductivity-type semiconductor layer 4 has a defective portion, the first conductivity-type crystalline semiconductor particles 3 directly connects to the other electrode 8 at the defective portion, causing inconveniences such as short circuit.

This also deteriorates the power generating property of the crystalline semiconductor particles 3 located under the part where the electrode 8 is formed, which negatively affects the conversion efficiency as a whole.

Forming the other electrode 8 on the insulator layer 2 does not lead to short circuit even if the second conductivity-type semiconductor layer 4 has a defective portion, but it only results in making the other electrode 8 to directly connect to the insulator layer 8. As a result, the photoelectric conversion device has high reliability and the overall conversion efficiency is not affected negatively.

Figure 12:
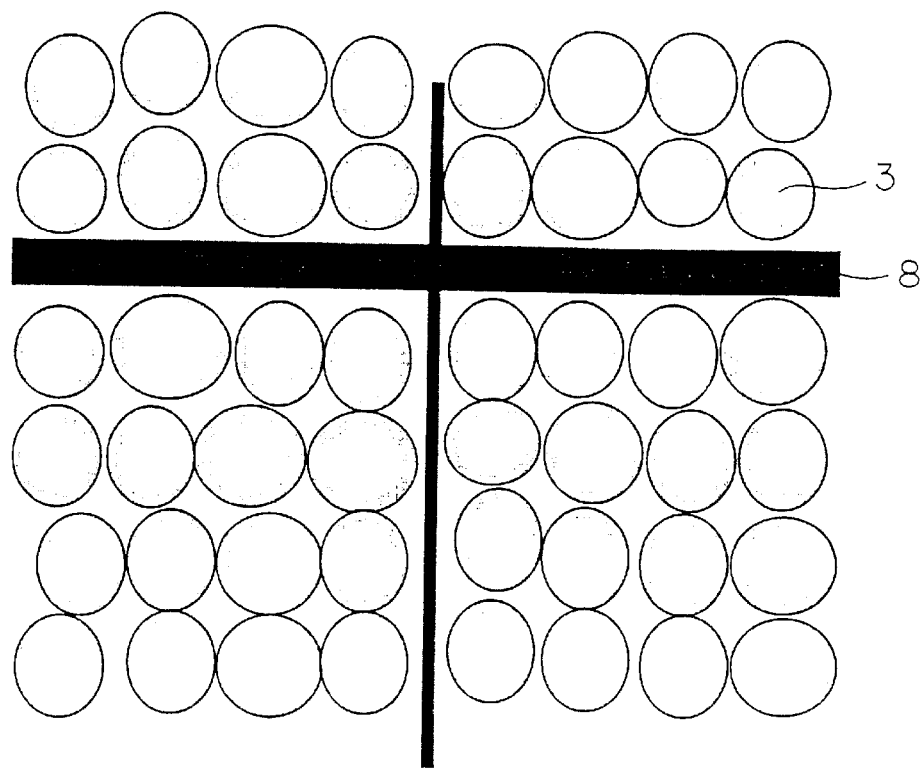
FIG. 12 is a plan view of a photoelectric conversion device according to the present invention.

FIG. 12 shows an embodiment of this invention viewed from the top. In this embodiment, the other electrode 8 is formed so as not to be located above the crystalline semiconductor particles 3.

The forming pattern of the other electrode 8 is not limited to the one shown in FIG. 12, but may be others employing fingers, bus bars, ribbon electrodes and through-holes, which are designed appropriately aiming at low series resistance and little light receiving loss.

EXAMPLE E

First, an insulator layer 2 was formed on a substrate 1 comprising aluminum. The insulator layer 2 was formed 50 μm thick on the substrate 1 by using glass paste. A glass whose softening temperature is 480° C. was used for the glass paste. Then, p-type silicon particles 3 with an average particle diameter of 800 μm were densely deposited on the insulator layer 2. A n-type silicon layer 4 was formed 200 nm thick over the silicon particles 3 and the insulator layer 2, on which a silicon nitride layer was formed 500 nm thick as a protective film. Subsequently, the other electrode 8 was formed by subjecting silver paste to screen printing and calcination. A result of evaluation in view of short circuit and conversion efficiency of samples (Samples 81–89) is shown in Table 10. In this example, the proportion of the area of the other electrode 8 formed on the insulator layer 2 and that formed above the silicon particles 3 were varied. One hundred samples were prepared for each sample No., and the evaluation in view of short circuit was carried out as follows: samples in which 20% or more suffered short circuit were marked by X; samples in which no less than 5% and less than 20% suffered short circuit were marked by Δ; samples in which no less than 1% and less than 5% suffered short circuit were marked by ○; and samples in which less than 1% suffered short circuit were marked by ⊙.

TABLE 10

| Sample No. | Proportion of the area of electrode above silicon particles (%) | Short circuit | Conversion efficiency (%) |
|---|---|---|---|
| 81 | 0 | ⊙ | 12.1 |
| 82 | 5 | ⊙ | 11.8 |
| 83 | 10 | ⊙ | 11.5 |
| 84 | 15 | ○ | 10.3 |
| 85 | 20 | ○ | 9.6 |
| 86 | 25 | Δ | 8.9 |
| 87 | 30 | Δ | 8.0 |
| 88 | 40 | Δ | 7.2 |
| 89 | 50 | X | 6.4 |

As the result above shows, the smaller the area of the electrode formed above the silicon particles was, the better the result was. In particular, when the proportion of the area of the electrode formed above the silicon particles was 10% or less, influence of such electrode formation was small. Accordingly, the samples 81–83 are an embodiment of this invention.

<Embodiment F>

Figure 13:
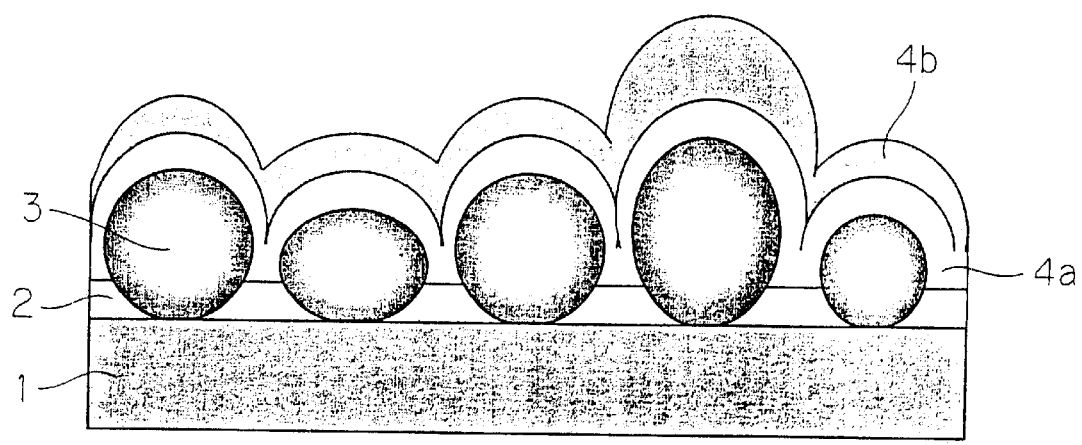
FIG. 13 is a cross-sectional view of a photoelectric conversion device according to the present invention.

FIG. 13 is a cross-sectional view showing an embodiment of the photoelectric conversion device according to this invention.

FIG. 13 shows a substrate 1, a insulating layer 2, a first conductivity-type crystalline semiconductor particle 3, a lower second conductivity-type semiconductor layer 4a, and an upper second conductivity-type semiconductor layer 4b.

Metals, ceramics, resins or the like are used for the substrate. Conductivity is the only characteristic required for the substrate 1 because it serves also as the lower electrode. When the substrate 1 is made of a metal, the substrate 1 should be a single layer or a combined layer in which different metals are combined. When the substrate 1 is made of an insulator such as ceramics or resin, it needs to be covered with a conductive layer.

The insulating layer 2 is formed in order to separate the positive electrode from the negative electrode. The insulating layer is formed by using, for example, glass slurry composed of components arbitrarily selected from among $SiO_2$, $Al_2O_3$, PbO, ZnO, and the like.

The thickness of the insulating layer 2 should preferably be not less than 1 μm nor more than ⅔ of the average particle size of the crystalline semiconductor particles 3. When the thickness of the insulating layer 2 exceeds ⅔ of the average particle size of the crystalline semiconductor particle 3, the PN-junction forming area becomes too small to efficiently collect carriers, which is unfavorable. When the thickness of the insulating layer 2 is less than 1 μm, insulation between the substrate 1 and the semiconductor layer 4 comprising a crystalline semiconductor and an amorphous semiconductor in a mixed manner becomes insufficient so that the substrate 1 and the semiconductor layer 4 partly come into contact causing short circuit, which is also unfavorable.

The first conductivity-type crystalline semiconductor particles 3 comprise Si, Ge, and a small amount of p-type impurity such as B, Al, and Ga, or n-type impurity such as P and As added thereto.

The shapes of the semiconductor particles 3 may be polygons, curved surfaces or the like. Preferably, they should comprise curved surfaces, especially spherical shapes so that they efficiently push the insulating layer 2 aside when they are pressed from above the insulating layer 2 into the insulating layer 2 until they come into contact with the substrate 1. The particle diameters may be even or uneven. However, uneven particle diameters will be advantageous to make the device less expensive, because an additional process is necessary in order to uniformize the particle diameters. Preferably, the particle diameters of the particles 3 should be in the range of 10–500 μm. Particles with diameters less than 10 μm are not preferable because they cause the insulating layer 2 to adhere to the pressing jig for pressing the particles, thereby contaminating the surfaces of semiconductor particles 3. Also, using semiconductor particles with diameters exceeding 500 μm makes no difference in the amount of the semiconductor material to be used from the amount used in conventional flat plate photoelectric conversion devices, which neutralizes the material-saving advantage of using spherical particles.

The lower second conductivity-type semiconductor layer 4a is formed by the catalytic CVD method, the VHF-CVD method, or the plasma CVD method, in which, for example, a vapor-phase phosphorous system compound that is a n-type impurity or a vapor-phase boron system compound that is a p-type impurity is added in a small amount to a vapor-phase silane compound.

Preferably, the lower second conductivity-type semiconductor layer 4a should be crystalline. When the lower second conductivity-type semiconductor layer 4 is amorphous, due to its large light absorption, the quantity of the light that can reach the crystalline semiconductor particles 3 is reduced, by which the conversion efficiency is lowered. However, when the crystallization rate is 80% or more, no such influence or dependence on the particle size is anticipated. It is preferable to design the upper second conductivity-type semiconductor layer 4b by putting importance on the PN-junction property. Preferably, the concentration of the added impurity should not be less than $2\times10^{16}$ $atm/cm^3$ nor more than $5\times10^{18}$ $atm/cm^3$. When the concentration of the added impurity is less than $2\times10^{16}$ $atm/cm^3$, the conversion efficiency is lowered due to increased series resistance. When it is larger than $5\times10^{18}$ $atm/cm^3$, leakage current is so great that the conversion efficiency is also lowered, which is inappropriate.

It is desirable to form the lower second conductivity-type semiconductor layer 4a along the surfaces of the semiconductor particles 3 so as to form the junction in the vicinity of the surface where light is incident as well as along the outer contours of the particles 3. Forming the junction along the surfaces of the semiconductor particles 3 makes it possible to efficiently collect carriers generated at any location within the crystalline semiconductor particles 3.

When the lower second conductivity-type semiconductor layer 4a is formed to have an irregular surface, a too thin thickness makes it difficult to thoroughly cover the exposed area of the particles along the surfaces thereof. On the other hand, when the thickness is too large, although the film exhibits good covering performance, loss caused by light absorption by the semiconductor layer 4 is so large that it lowers the conversion efficiency. The thickness should preferably be from 20 to 100 nm. At thicknesses below 20 nm, the covering performance deteriorates bringing the semiconductor particles 3 into direct contact with the upper second conductivity-type semiconductor layer 4b. This results in generation of a large amount of leakage current causing the conversion efficiency to drop, which is unfavorable. Also, at thicknesses above 100 nm, the series resistance is so large that the conversion efficiency drops along with the productivity. In addition, the increased material cost results in high cost manufacture.

The upper second conductivity-type semiconductor layer 4b is formed in the same way as in the lower second conductivity-type semiconductor layer 4a by the catalytic CVD method, the VHF-CVD method, or the plasma CVD method, in which, for example, a vapor-phase phosphorous system compound that is a n-type impurity or a vapor-phase boron system compound that is a p-type impurity is added in a small amount to a vapor-phase silane compound.

It is desirable for the upper second conductivity-type semiconductor layer 4b to be crystalline. When the upper second conductivity-type semiconductor layer 4b is amorphous, due to its large light absorption, the quantity of the light that can reach the crystalline semiconductor particles 3 is reduced, by which the conversion efficiency is lowered. However, when the crystallization rate is 80% or more, no such influence or dependence on the particle size is anticipated. It is preferable to design the upper second conductivity-type semiconductor layer 4b by putting importance on the PN-junction property. The concentration rate of the added impurity should preferably be $5\times10^{19}$ atm/cm$^3$ or more. When the concentration of the added impurity is below $5\times10^{19}$ atm/cm$^3$, the conversion efficiency is lowered due to increased series resistance.

The upper second conductivity-type semiconductor layer 4b serves also as an auxiliary electrode that collects light current generated in each crystalline semiconductor particle and transfers it to the metal electrode. In order to obtain the sheet resistance (for instance, 100 Ω/cm$^2$ or less) required for an auxiliary electrode, the thickness needs to be large. However, thickening the film leads to an increase of the light absorption by the upper second conductivity-type semiconductor layer 4b, thereby lowering the conversion efficiency, which is therefore inappropriate. Preferably, the thickness should be between 50 and 500 nm. Any thickness less than 50 nm causes the sheet resistance to be large lowering the conversion efficiency, which is unfavorable. Also, any thickness above 500 nm is also unfavorable because of an increase of loss due to the light absorption, which results in lowering of the conversion efficiency.

In addition, it is preferable for the thickness of the upper second conductivity-type semiconductor layer 4b to be larger than that of the lower second conductivity-type semiconductor layer 4a. When the lower second conductivity-type semiconductor layer 4a is thicker, the series resistance is increased lowering the conversion efficiency. Preferably, the thickness of the lower second conductivity-type semiconductor layer 4a should be the lower limit that allows for good covering performance, while the thickness of the upper second conductivity-type semiconductor layer 4b should be larger than that of the lower second conductivity-type semiconductor layer 4a so as to reduce the series resistance.

Meanwhile, when an intermediate semiconductor layer having an intermediate impurity concentration was provided between the lower second conductivity-type semiconductor layer 4a and the upper second conductivity-type semiconductor layer 4b, similar effects were attained. Furthermore, when the impurity concentration is successively increased from the lower to the upper, similar effects were also attained.

Moreover, it is also possible to provide a protective film (not shown) on the upper second conductivity-type semiconductor 4b. The protective film is formed by using a material such as silicon nitride or titanium oxide by the sputtering method, the plasma CVD method or the like. It is possible to provide this protective film with a function that brings a multiple reflection effect, an antireflection effect, or a weather resistance improvement effect.

EXAMPLE F

First, an insulating layer 2 was formed on a substrate 1 comprising aluminum. The insulating layer 2 was formed 50 μm thick by using glass paste, on which polycrystalline p-type silicon particles 3 with an average particle diameter of 100 μm were densely deposited to form a layer. Then, it was heated up to the softening temperature of the insulator 2 or above so that the silicon particles 3 were sunk into the insulating layer 2 until they came into contact with the substrate 1. Subsequently, a lower n-type crystalline silicon layer 4a was formed over the silicon particles 3 and the insulating layer 2. The concentration of phosphorous added to the lower n-type crystalline silicon layer 4a was $1\times10^{17}$ atm/cm$^3$. A result of evaluation of the properties obtained by varying the structure and the thickness of the lower n-type crystalline silicon layer 4a is shown in FIG. 11 (Samples 92–97). On this layer 4a, an upper n-type crystalline silicon layer 4b is formed 100 nm thick. The concentration of phosphorous added to the upper n-type crystalline silicon layer 4b was $3\times10^{20}$ atm/cm$^3$. A protective film comprising silicon nitride was formed 500 nm on this layer.

In addition, as a comparative example, another sample was made such that a n-type crystalline silicon layer was formed as a single layer without including a lower n-type silicon layer 4a. A result from this sample is also shown in Table 11 (Sample 91).

TABLE 11

| Sample No. | Structure | Thickness (nm) | Conversion efficiency (%) |
| --- | --- | --- | --- |
| 91 | — | 0 | 2.2 |
| 92 | Crystalline | 10 | 5.5 |
| 93 | Crystalline | 20 | 12.5 |
| 94 | Crystalline | 50 | 13.1 |
| 95 | Crystalline | 100 | 10.3 |
| 96 | Crystalline | 200 | 7.8 |
| 97 | Crystalline | 300 | 5.3 |
| 98 | Amorphous | 10 | 3.5 |
| 99 | Amorphous | 20 | 3.2 |
| 98 | Amorphous | 50 | 2.6 |
| 99 | Amorphous | 100 | 2.1 |
| 100 | Amorphous | 200 | 1.5 |
| 101 | Amorphous | 300 | 0.6 |

As is apparent from the result in Table 11, the preferred structure of the lower n-type crystalline silicon layer 4a is crystalline, and the thickness should be from 20 to 100 nm. The samples 93–95 correspond to the present invention.

In the case of lacking the lower n-type crystalline silicon layer (Sample 91), direct contact between the upper n-type crystalline silicon layer 4b having a high impurity concentration and the p-type silicon particles 3 caused leakage current to increase, which resulted in the drastic drop in the conversion efficiency.

In another case, the structure and the thickness of the upper n-type silicon layer 4b were varied with the structure and the thickness of the lower n-type silicon layer 4a being fixed at crystalline and 50 nm, respectively. A result of evaluation is shown in Table 12 (Samples 111–123).

TABLE 12

| Sample No. | Structure | Thickness (nm) | Conversion efficiency (%) |
|---|---|---|---|
| 111 | — | 0 | 4.5 |
| 112 | Crystalline | 30 | 7.2 |
| 113 | Crystalline | 50 | 10.2 |
| 114 | Crystalline | 100 | 13.1 |
| 115 | Crystalline | 250 | 13.0 |
| 116 | Crystalline | 500 | 10.4 |
| 117 | Crystalline | 750 | 6.6 |
| 118 | Amorphous | 30 | 4.3 |
| 119 | Amorphous | 50 | 3.5 |
| 120 | Amorphous | 100 | 2.4 |
| 121 | Amorphous | 250 | 0.9 |
| 122 | Amorphous | 500 | 0.5 |
| 123 | Amorphous | 750 | 0.4 |

The result shown above indicates that the preferred structure of the upper n-type crystalline silicon layer 4b is crystalline, and the thickness thereof should preferably be from 50 to 500 nm. The samples 113–116 correspond to the present invention.

In the case of lacking the upper n-type crystalline silicon layer 4b (Sample 111), the series resistance increases causing the conversion efficiency to decrease. That is, when a n-type crystalline silicon layer having a uniform impurity concentration is used, decreasing the impurity concentration results in an increase of the series resistance, and increasing the impurity concentration results in an increase of leakage current. Accordingly, it is difficult to strike a good balance between them.

What is claimed is:

1. A photoelectric conversion device comprising:
    first conductivity-type crystalline semiconductor particles being deposited on and in contact with a substrate;
    an insulator formed in an area on the substrate where the crystalline semiconductor particles are not present;
    and a second conductivity-type semiconductor layer formed over the crystalline semiconductor particles and the insulator so as to form a PN-junction between the semiconductor layer and the crystalline semiconductor particles,
    wherein the second conductivity-type semiconductor layer comprises a semiconductor layer including a crystalline semiconductor and an amorphous semiconductor in a mixed manner, and a part where the crystalline semiconductor particles are in contact with the second conductivity-type semiconductor layer has a convex configuration.

2. The photoelectric conversion device according to claim 1, wherein the thickness of the semiconductor layer including a crystalline semiconductor and an amorphous semiconductor in a mixed manner is in the range of 50–300 nm.

3. The photoelectric conversion device according to claim 1, wherein the semiconductor layer including a crystalline semiconductor and an amorphous semiconductor in a mixed manner is formed along the surfaces of the crystalline semiconductor particles.

4. The photoelectric conversion device according to claim 1, further comprising a transparent conductive layer formed on the semiconductor layer including a crystalline semiconductor and an amorphous semiconductor in a mixed manner.

5. The photoelectric conversion device according to claim 1, wherein the semiconductor layer including a crystalline semiconductor and an amorphous semiconductor in a mixed manner functions as an upper electrode.

6. The photoelectric conversion device according to claim 1, further comprising a dielectric protective film formed on the semiconductor layer including a crystalline semiconductor and an amorphous semiconductor in a mixed manner.

7. The photoelectric conversion device according to claim 1, wherein the particle diameters of the crystalline semiconductor particles are in the range of 10–500 $\mu$m.

8. The photoelectric conversion device according to claim 6, wherein the semiconductor layer including a crystalline semiconductor and an amorphous semiconductor in a mixed manner has a thickness in the range of 50–400 nm.

9. A photoelectric conversion device comprising:
    first conductivity-type crystalline semiconductor particles being deposited on and in contact with a substrate;
    an insulator formed in an area on the substrate where the crystalline semiconductor particles are not present;
    and a second conductivity-type semiconductor layer formed over the crystalline semiconductor particles and the insulator so as to form a PN-junction between the semiconductor layer and the crystalline semiconductor particles, wherein the substrate comprises a first aluminum-iron alloy layer, an iron layer, a second aluminum-iron alloy layer, and an aluminum layer in a laminated manner.

10. The photoelectric conversion device according to claim 9, wherein the first aluminum-iron alloy layer is thinner than the second aluminum-iron alloy layer.

11. The photoelectric conversion device according to claim 9, wherein the first aluminum-iron alloy layer is not less than 2 $\mu$m nor more than 100 $\mu$m in thickness and the second aluminum-iron alloy layer is not less than 2 $\mu$m nor more than 100 $\mu$m in thickness.

12. The photoelectric conversion device according to claim 9, wherein the substrate is formed by sequentially laminating a first aluminum layer, an iron layer, and a second aluminum layer, and applying heat thereto.

13. A photoelectric conversion device comprising:
    first conductivity-type crystalline semiconductor particles being deposited on and in contact with a substrate;
    an insulator formed in an area on the substrate where the crystalline semiconductor particles are not present;
    and a second conductivity-type semiconductor layer formed over the crystalline semiconductor particles and the insulator so as to form a PN-junction between the semiconductor layer and the crystalline semiconductor particles,
    wherein the insulator comprises a plurality of materials selected from the group consisting of $SiO_2$, $B_2O_3$, $Al_2O_3$, CaO, MgO, $P_2O_3$ and $Li_2O$, and the relation in weight between the insulator and the crystalline semiconductor particles is $V1 \times \rho1 \geq V2 \times \rho2$ where V1 is the volume of one crystalline semiconductor particle, V2 is the volume of one crystalline semiconductor particle in a part being buried in the insulator, $\rho1$ is the specific gravity of the crystalline semiconductor particles, and $\rho2$ is the specific gravity of the insulator.

14. The photoelectric conversion device according to claim 13, wherein the insulator comprises at least one kind of filler selected from the group consisting of $SiO_2$, $Al_2O_3$, CaO, MgO and $TiO_2$.

15. A photoelectric conversion device comprising:
    first conductivity-type crystalline semiconductor particles being deposited on and in contact with a substrate;
    an insulator formed in an area on the substrate where the crystalline semiconductor particles are not present;
    a second conductivity-type semiconductor layer formed over the crystalline semiconductor particles and the insulator so as to form a PN-junction between the semiconductor layer and the crystalline semiconductor particles;

and an electrode formed in the second conductivity-type semiconductor layer, wherein the electrode is formed such that the area of a portion of the electrode that is present above the crystalline semiconductor particles is not more than 10% of the whole area of the electrode.

16. A photoelectric conversion device comprising:

first conductivity-type crystalline semiconductor particles being deposited on and in contact with a substrate;

an insulator formed in an area on the substrate where the crystalline semiconductor particles are not present; and a second conductivity-type semiconductor layer formed over the crystalline semiconductor particles and the insulator so as to form a PN-junction between the semiconductor layer and the crystalline semiconductor particles, wherein the second conductivity-type semiconductor layer comprises two layers each of which has an impurity addition concentration that differs from the other such that the impurity addition concentration in the lower layer of the second conductivity-type semiconductor layer is lower than that in the upper layer of the second conductivity-type semiconductor layer.

17. The photoelectric conversion device according to claim 16, wherein the lower second conductivity-type semiconductor layer is crystalline.

18. The photoelectric conversion device according to claim 16, wherein the upper second conductivity-type semiconductor layer is crystalline.

19. The photoelectric conversion device according to claim 16, wherein the lower second conductivity-type semiconductor layer has a thickness in the range of 20–100 nm.

20. The photoelectric conversion device according to claim 16, wherein the upper second conductivity-type semiconductor layer has a thickness in the range of 50–500 nm.

21. The photoelectric conversion device according to claim 16, wherein the lower second conductivity-type semiconductor layer has a thickness in the range of 20–100 nm and the upper second conductivity-type semiconductor layer has a thickness in the range of 50–500 nm, and the thickness of the upper second conductivity-type semiconductor layer is larger than that of the lower second conductivity-type semiconductor layer.

22. The photoelectric conversion device according to claim 16, further comprising a dielectric protective film formed on the upper second conductivity-type semiconductor layer.

23. The photoelectric conversion device according to claim 16, wherein a part where the crystalline semiconductor particles are in contact with the lower second conductivity-type semiconductor layer has a convex configuration.

24. The photoelectric conversion device according to claim 16, wherein the particle diameters of the crystalline semiconductor particles are in the range of 10–500 $\mu$m.

* * * * *